(12) United States Patent
Fukui

(10) Patent No.: US 7,528,954 B2
(45) Date of Patent: May 5, 2009

(54) METHOD OF ADJUSTING OPTICAL IMAGING SYSTEM, POSITIONAL DEVIATION DETECTING MARK, METHOD OF DETECTING POSITIONAL DEVIATION, METHOD OF DETECTING POSITION, POSITION DETECTING DEVICE AND MARK IDENTIFYING DEVICE

(75) Inventor: Tatsuo Fukui, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/604,354

(22) Filed: Nov. 27, 2006

(65) Prior Publication Data

US 2007/0064233 A1 Mar. 22, 2007

Related U.S. Application Data

(63) Continuation of application No. PCT/JP2005/009749, filed on May 27, 2005.

(30) Foreign Application Priority Data

| May 28, 2004 | (JP) | ............................. 2004-158874 |
| May 31, 2004 | (JP) | ............................. 2004-161611 |
| Jul. 14, 2004 | (JP) | ............................. 2004-206888 |
| Jul. 29, 2004 | (JP) | ............................. 2004-222331 |

(51) Int. Cl.
*G01B 11/00* (2006.01)
*G01B 9/00* (2006.01)
*G01B 11/14* (2006.01)
*G01R 31/26* (2006.01)
*H01L 21/66* (2006.01)

(52) U.S. Cl. ...................... 356/401; 356/124; 356/614

(58) Field of Classification Search ...................... None
See application file for complete search history.

(56) References Cited

U.S. PATENT DOCUMENTS

| 6,130,747 A * | 10/2000 | Nomura et al. .......... 356/239.2 |
| 6,268,903 B1 * | 7/2001 | Chiba et al. ................ 355/53 |
| 6,421,123 B1 * | 7/2002 | Shiraishi ..................... 356/399 |
| 6,538,740 B1 * | 3/2003 | Shiraishi et al. ............ 356/401 |
| 2002/0060793 A1 * | 5/2002 | Fukui ........................ 356/400 |

FOREIGN PATENT DOCUMENTS

JP 06-267818 A 9/1994

(Continued)

*Primary Examiner*—Gregory J Toatley, Jr.
*Assistant Examiner*—Gordon J Stock, Jr.
(74) *Attorney, Agent, or Firm*—Arent Fox LLP

(57) ABSTRACT

A method of adjusting optical imaging system is provided to finely adjust arrangement of optical elements with sensitivity. Illumination light with a predetermined wavelength band is irradiated to an adjustment mark including first marks disposed at a first pitch and second marks disposed at a second pitch different from the first pitch. An image is captured according to light, of diffracted light emitted from the adjustment mark, passing through an aperture stop and reaching an image surface of the optical imaging system. A positional deviation between the first and second marks is calculated with symmetric/asymmetric property of luminance information. Based on respective positional deviations calculated while the wavelength band of illumination light is changed, arrangement of optical elements between a pupil plane and an aperture stop surface of the optical imaging system is finely adjusted, to correct imaging positional deviation of a pupil image on the aperture stop surface.

5 Claims, 24 Drawing Sheets

FOREIGN PATENT DOCUMENTS

| | | |
|---|---|---|
| JP | 07-151514 A | 6/1995 |
| JP | 09-089528 A | 4/1997 |
| JP | 10-122816 A | 5/1998 |
| JP | 2000-077295 A | 3/2000 |
| JP | 2002-328288 A | 11/2002 |
| JP | 2003-054058 A | 2/2003 |
| JP | 2004-134473 A | 4/2004 |
| JP | 2004-134474 A | 4/2004 |

* cited by examiner (a)

+PRIMARY   ZEROTH   −PRIMARY (b)

(c)

(a)

+PRIMARY   ZEROTH   −PRIMARY (b)

(c)

(a)

+PRIMARY ZEROTH −PRIMARY (b)

(c)

(a)

+PRIMARY  ZEROTH  −PRIMARY (b)

+PRIMARY           ZEROTH           −PRIMARY (a) 10 POSITIONAL DEVIATION DETECTING MARK (b) 10A UNDERLYING MARK (c) 10B RESIST MARK (a) 20 SUPERPOSITION MEASURING DEVICE (a) 70 POSITIONAL DEVIATION DETECTING MARK (b) 70B RESIST MARK (c)

(a) 10 SUPERPOSITION INSPECTING DEVICE (b)

(a)

(b)

(a)

(b)

(c)

METHOD OF ADJUSTING OPTICAL IMAGING SYSTEM, POSITIONAL DEVIATION DETECTING MARK, METHOD OF DETECTING POSITIONAL DEVIATION, METHOD OF DETECTING POSITION, POSITION DETECTING DEVICE AND MARK IDENTIFYING DEVICE

CROSS REFERENCE TO RELATED APPLICATION

This application is a continuation application of International Application PCT/JP 2005/009749, filed on May 27, 2005, designating the U.S., and claims the benefit of priority from Japanese Patent Application No. 2004-158874, filed on May 28, 2004, No. 2004-161611, filed on May 31, 2004, No. 2004-206888, filed on Jul. 14, 2004, and No. 2004-222331, filed on Jul. 29, 2004, the entire contents of which are incorporated herein by reference.

BACKGROUND OF THE INVENTION

1. Field of the Invention

The present invention relates to a method of adjusting optical imaging system which forms an image of an object. The present invention also relates to a positional deviation detecting mark for use in detecting positional deviation of a pattern in a production process of semiconductor devices and liquid crystal display devices and a method of detecting positional deviation. The present invention further relates to a method and a device for detecting a position of a pattern on a substrate. The present invention further relates to a mark identifying device.

2. Description of Related Art (First Related Art)

In production processes of semiconductor devices and liquid crystal display devices, a circuit pattern is transferred to a resist layer through a well known lithographic process. The circuit pattern is transferred to a predetermined material film (a pattern forming process) through processing such as etching via the resist pattern. By repeating the pattern forming process many times, circuit patterns of various material films are laminated on a substrate (a semiconductor wafer or a liquid crystal substrate) to form a circuit of a semiconductor device or a liquid crystal display device.

Further, in the production process, in order to superpose circuit patterns of various material films with high accuracy (for the purpose of improving the yield of products), the substrate is aligned before a lithographic process, and superposition of the resist patterns on the substrate is inspected after the lithographic process and prior to a machining process in the respective pattern forming processes. An alignment mark formed on an underlying layer in a preceding pattern forming process is used fro the alignment of the substrate. The superposition mark formed on the resist layer in a current pattern forming process and that formed on the underlying layer in the preceding process are used for the superposition inspection of the resist patterns.

In addition, a substrate alignment device or a device for superposition inspection of resist patterns on the substrate incorporates a device for detecting the position of the aforementioned alignment mark and superposition mark (all of which are simply referred to as the mark). The position detecting device detects the position of the mark by irradiating a mark to be detected with illumination light, capturing an image according to light from the mark (for example, reflected light) with an image pickup device such as a CCD camera, and performing predetermined image processing on the image. In order to obtain a stable reflection intensity for a wide variety of structures of the mark, the wavelength band of the illumination light is often determined to be a broad band range from a visible light band to a nearly infrared light band.

Further, in order to enhance the detection accuracy, a position detecting device finely adjusts the arrangement of an aperture stop of an optical imaging system (an optical system for forming an image of the mark) and an objective lens in the shift direction, to thereby reduce an error component induced by a device (TIS value: Tool Induced Shift), by a method, for example, disclosed in Japanese Unexamined Patent Application Publication No. 2000-77295.

(Second Related Art)

Superposition inspection (positional deviation detection) usually uses an underlying mark indicating the reference position of an underlying pattern and a resist mark indicating the reference position of a resist pattern. Each of the underlying mark and the resist mark is formed at the same time when the underlying pattern or the resist pattern are formed in the aforementioned pattern forming process, which constitutes a duplex mark 80 in a square shape as shown in FIG. 19 (for example, see Japanese Unexamined Patent Application Publication No. 7-151514). FIG. 19 is a plan view of the duplex mark 80. Generally, in the duplex mark 80, the outer mark is an underlying mark 81 and the inner mark is a resist mark 82. The size D1 of the underlying mark 81 is, for example, about 30 μm, and the size D2 of the resist mark 82 is about 15 μm. The underlying mark 81 and the resist mark 82 are arranged so that their respective centers coincide when there is no positional deviation between the underlying pattern and the resist pattern.

Then, upon superposition inspection using the underlying mark 81 and resist mark 82, a measurement point including two marks (81, 82) are positioned in the visual field of the device, capturing the image of the measurement point with an image pickup device such as a CCD camera. Further, the images of edge portions of corners of the underlying mark 81 and the resist mark 82 is clipped from the captured image, and obtained partial images are subjected to a predetermined image processing, to calculate positional deviation amount between the center of the underlying mark 81 and the center of the resist mark 82. The calculated positional deviation amount represents a positional deviation of the resist pattern relative to the underlying pattern.

(Third Relate Art)

The substrate alignment device or the device for the superposition inspection of a resist pattern on a substrate incorporates a device that detects the position of the aforementioned alignment mark and superposition mark (all of which are simply referred to as the mark). The position detecting device generally detects the position of the mark by illuminating a substrate with white light, capturing an image of the mark with an image pickup device such as a CCD camera, and performing predetermined image processing on the image (for example, see Japanese Unexamined Patent Application Publication No. 7-151514).

(Fourth Related Art)

In order to identify a mark to be measured from marks (such as the alignment mark and superposition mark) on a substrate such as a wafer with a semiconductor measuring appratus, first, a mark as a reference for identification is photographed in advance and the image thereof is registered in a recipe. Subsequently, the mark is identified by comparing a mark to be measured with the mark registered in the recipe. (for example, see Japanese Unexamined Patent Application Publication No. 9-89528).

However, according to the aforementioned method of adjusting the optical imaging system of the first related art, it is not possible to reduce the error component (TIS value) of the device sufficiently when the imaging position of the pupil image on the aperture stop surface of the optical imaging system changes depending on the wavelength band due to production error (eccentric error of optical elements) or the like in disposing respective optical elements of the optical imaging system.

In view of solving the above problem, the inventors of the present invention proposed (in Japanese Patent Application No. 2003-54058) to correct the deviation of the imaging positional of the pupil image on the aperture stop surface depending on the wavelength band by arranging a new optical element for adjustment between the pupil plane and the aperture stop surface of the optical imaging system and finely adjusting the arrangement of the optical element, using the method disclosed in Japanese Unexamined Patent Application Publication No. 2000-77295. However, it is difficult to decrease adjustment error by the method disclosed therein since the arrangement of the optical element cannot be finely adjusted with a good sensitivity. Therefore, it is not possible to reduce the error component due to the device (TIS value) sufficiently and improve the detection accuracy sufficiently.

SUMMARY OF THE INVENTION

A first object of the present invention is to provide a method of adjusting an optical imaging system, which can finely adjust the arrangement of optical elements with high sensitivity.

In order to deal with the miniaturization of circuit patterns along with high integration of a semiconductor device or the like of the second related art, there has been a demand for improving the precision of the aforementioned positional deviation detection (superposition inspection). However, in detecting the positional deviation with the aforementioned duplex mark in a square shape, the positional deviation amount between the underlying mark and the resist mark may not be detected accurately due to distortion of the optical imaging system forming the image of the duplex mark on the imaging surface of an image pickup device. Such a problem may occur not only in two marks formed on different layers of a substrate but also in two marks formed on the same layer of a substrate.

A second object of the invention is to provide a mark and a method for the positional deviation detection which makes it possible to reduce the influence of the distortion of an optical imaging system upon the positional deviation detection.

A detection device according to the third related art has one or more intermediate layers (such as unprocessed material films) formed between the underlying layer and the resist layer of the substrate for detecting the position of the mark. When the substrate is illuminated with white light as in the third related art, therefore, it may not be able to detect the accurate position of a mark on the underlying layer of the substrate, affected by the intermediate layer. An error in the positional detection due to the influence of the intermediate layer used to be considered as negligibly small, compared with the process rule, however, it is not negligible anymore due to the miniaturization of the circuit pattern.

Such a problem as described above may occur not only in detecting a position of a mark (such as an alignment mark or a superposition mark) on a substrate, but also in detecting a position of the circuit pattern on a substrate. Herein, generally, all the marks (such as an alignment mark and a superposition mark) and circuit patterns are simply referred to as pattern.

A third object of the invention is to provide a method and a device for positional detection which can reduce the influence of the intermediate layer formed between the underlying layer and the resist layer, thereby accurately detecting a position of the pattern on the underlying layer.

According to the method of the fourth related art, a substrate having a mark thereon is necessary for registering an image of the mark registered in advance in a recipe.

A fourth object of the invention is to provide a mark identifying device which can identify a mark to be measured from an obtained image without using a substrate having the mark.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

First Embodiment

Figure 1:
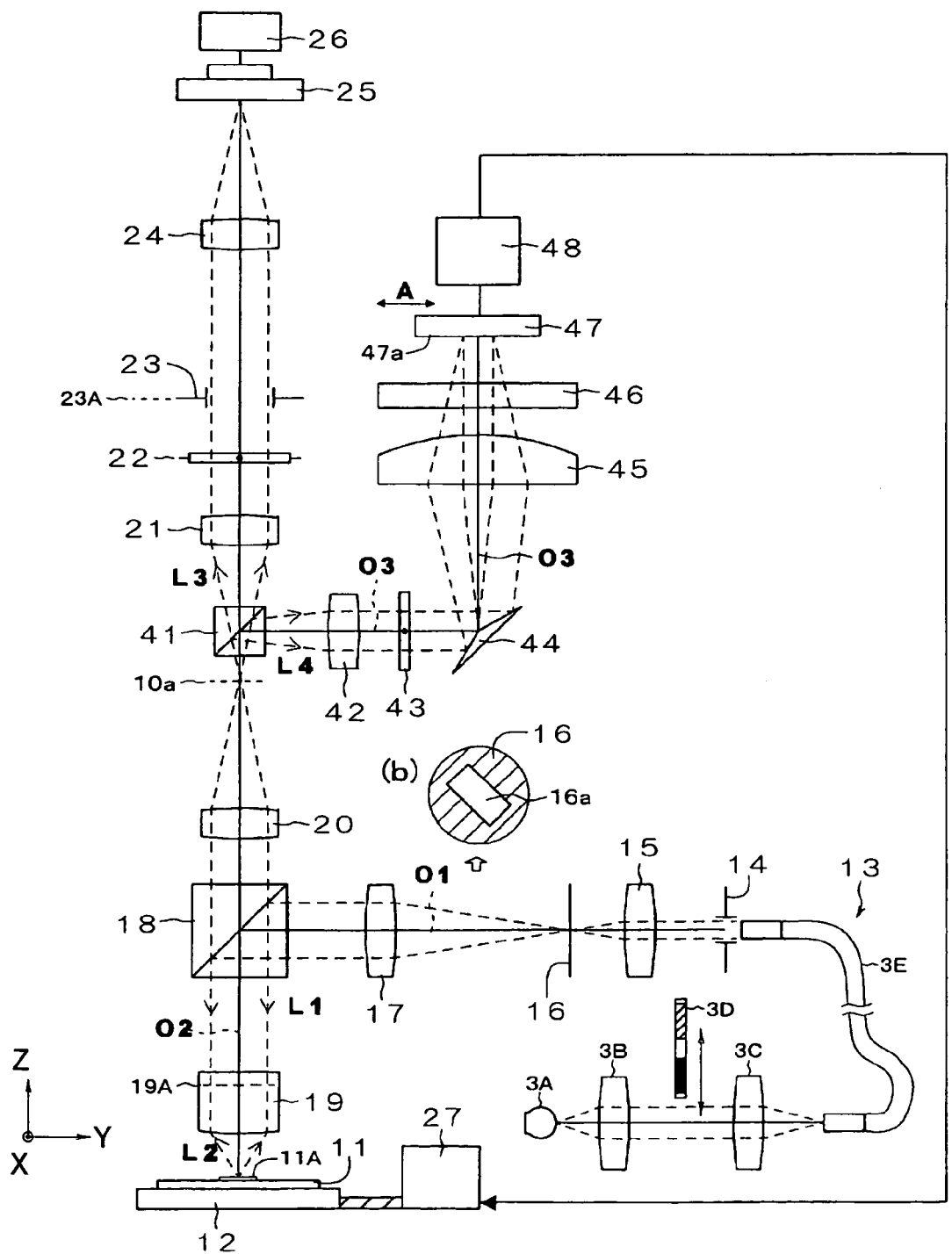
FIG. 1 shows the whole constitution of a superposition measuring device 10 according to a first embodiment.

Hereinafter, a first embodiment of the present invention will be described in detail using FIGS. 1 to 10.

Here, the method of adjusting optical imaging system of the first embodiment will be described while taking the superposition measuring device 10 shown in FIG. 1 as an example. The superposition measuring device 10 is a device for superposition inspection of a resist pattern of a substrate 11 (not shown) in a production process of a semiconductor device, a liquid crystal display device or the like. In the superposition inspection, a positional deviation amount of a resist pattern relative to a circuit pattern formed on an underlying layer of the substrate 11 (hereinafter, referred to as an underlying pattern) is measured.

As shown in FIG. 1(a), the superposition measuring device 10 is provided with a stage 12 for supporting the substrate 11 or an substrate 30 for adjustment to be later described (FIG. 2), an illuminating optical system (13 to 19), an optical imaging system (19 to 24), a CCD image pickup device 25, an image processing section 26, a focus detection section (41 to 48), and a stage controlling section 27.

The stage 12 is constituted of a holder for supporting the substrate 11 or the substrate 30 for adjustment to be later described (FIG. 2) while maintaining the same at a horizontal level, an XY driving section for driving the holder in horizontal directions (XY directions), and a Z driving section for driving the holder in the vertical direction (Z direction), the illustration thereof being omitted. The XY driving section and Z driving section are connected to the stage controlling section 27.

Here, the substrate 11 is a common substrate product such as a semiconductor wafer or a liquid crystal substrate, and is in a state after exposure/development for a resist layer and before a processing for a predetermined material film. For the substrate product, many measurement points are prepared for superposition inspection. Positions of measurement points are at four corners of respective shot regions or the like. At respective measurement points, formed are a resist mark showing the reference position of the resist pattern and an underlying mark showing the reference position of the underlying pattern. In the following description, the whole resist mark and the underlying mark are generally referred to as a superposition mark 11A.

Figure 2:
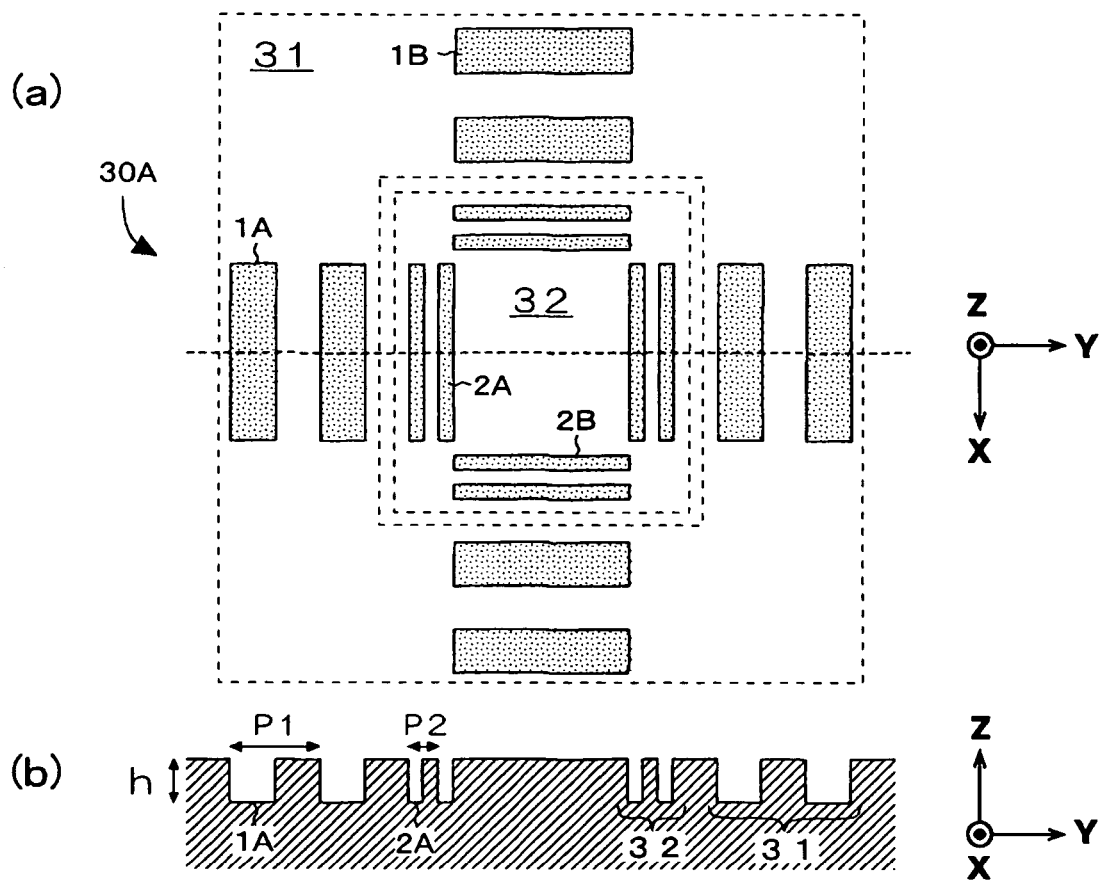
FIG. 2 shows the constitution of an adjustment mark 30A of a substrate for adjustment 30.

The substrate for adjustment 30 (FIG. 2) is designed for obtaining an index upon adjusting the optical imaging system (19 to 24). The substrate for adjustment 30 is provided with the adjustment mark 30A including the outer mark 31 and the inner mark 32. The adjustment mark 30A is a BAR in BAR type duplex mark, and is prepared by etching treatment of a silicon wafer or the like. The step h of the adjustment mark 30A is, for example, 83 nm. FIG. 2(a) is a plan view and FIG. 2(b) is a cross-sectional view.

The outer mark 31 is constituted of four bar marks 1A elongated in the X direction and four bar marks 1B elongated in the Y direction, wherein two of respective marks form a pair to be arranged around the inner mark 32 in a 4-side figure. The four bar marks 1A are disposed at a pitch P1 in each pair. In the same way, the four bar marks 1B are also disposed at the pitch P1 in each pair. The pitch P1 is, for example, 3.8 μm.

The inner mark 32 is constituted of four bar marks 2A elongated in the X direction and four bar marks 2B elongated in the Y direction, wherein two of the respective marks form a pair to be arranged inside the outer mark 31 in a 4-side figure. The four bar marks 2A are disposed at a pitch P2 different from the pitch P1 in each pair. In the same way, the four bar marks 2B are also disposed at the pitch P2 in each pair. The pitch P2 is, for example, 1 μm.

In such state that the substrate 11 (or the substrate for adjustment 30) is supported by a holder of the stage 12, the stage controlling section 27 controls the XY driving section of the stage 12, and moves the holder in XY directions to position the superposition mark 11A on the substrate 11 (or the adjustment mark 30A on the substrate for adjustment 30) in the viewing region. Further, it controls the Z driving section of the stage 12 based on later-described focus signals output form the focus detecting section (41 to 48), and moves the holder up and down in the Z direction. By the focus adjustment, the substrate 11 (or the substrate for adjustment 30) can be focused for the image pickup surface of the CCD image pickup device 25. At this time, the superposition mark 11A on the substrate 11 (or the adjustment mark 30A on the substrate for adjustment 30) is arranged on the object surface of the optical imaging system (19 to 24).

The illuminating optical system (13 to 19) is constituted of a light source section 13;

an illumination aperture stop 14, a condenser lens 15, a visual field diaphragm 16, an illuminating relay lens 17 and a beam splitter 18 sequentially arranged along the optical axis O1; and a first objective lens 19 arranged on an optical axis O2. The beam splitter 18 is arranged such that the reflection/transmission surface is tilted approximately 45° relative to the optical axis O1, and is also arranged on the optical axis O2. The optical axis O1 of the illuminating optical system (13 to 19) is perpendicular to the optical axis O2 of the optical imaging system (19 to 24).

The light source section 13 is constituted of a light source 3A, a collector lens 3B, an optical relay lens 3C, a wavelength switching mechanism 3D and a light guide fiber 3E. The light source 3A emits light with a broad wavelength band (for example, white light). The wavelength switching mechanism 3D is provided with plural optical filters having different transmission properties. By switching the optical filter and inserting it in an illumination light path, it is possible to select any of a broad band (for example, a wavelength width is around 270 nm in the embodiment), a long wavelength band or a short wavelength band out of wavelength bands of the light emitted from the light source 3A.

In the light source section 13, the light with a broad wavelength band emitted from the light source 3A enters an optical filter of the wavelength switching mechanism 3D through the collector lens 3B to be a light in the wavelength band corresponding to the transmission property thereof (that is, a broad band, long wavelength band or short wavelength band). After that, it is guided to the illumination aperture stop 14 through the optical relay lens 3C and the light guide fiber 3E.

The illumination aperture stop 14 lies so that the center thereof is on the optical axis O1, and limits the diameter of the light emitted from the light source section 13 to a specified diameter. The condenser lens 15 condenses the light from the illumination aperture stop 14.

The visual field diaphragm 16 is an optical element that limits the viewing region of the superposition measuring device 10, and has one slit 16a being an aperture in a rectangular shape, as shown in FIG. 1(*b*). The illuminating relay lens 17 collimates the light from the slit 16a of the visual field diaphragm 16. The beam splitter 18 reflects the light from the illuminating relay lens 17 downward.

In the above constitution, the light emitted from the light source section 13 uniformly illuminates the visual field diaphragm 16 through the illumination aperture stop 14 and the condenser lens 15. The light passing through the slit 16a of the visual field diaphragm 16 is guided to the beam splitter 18 through the illuminating relay lens 17, reflected from the reflection/transmission surface thereof (illumination light L1), and then guided to the first objective lens 19 on the optical axis O2.

The first objective lens 19 receives and condenses the illumination light L1 emitted from the beam splitter 18. As the result, the substrate 11 (or the substrate for adjustment 30) on the stage 12 is vertically illuminated by the illumination light L1 of a predetermined wavelength band passing through the first objective lens 19 (epi-illumination).

In this connection, an incident angle of the illumination light L1 when it enters the substrate 11 (or the substrate for adjustment 30) is determined by the positional relation between the center of the illumination aperture stop 14 and the optical axis O1. The range of incident angle of the illumination light L1 at respective points of the substrate 11 (or the substrate for adjustment 30) is determined by the aperture diameter of the illumination aperture stop 14, because the illumination aperture stop 14 is in a conjugated positional relation with a virtual pupil plane 19A of the first objective lens 19.

Further, since the visual field diaphragm 16 and the substrate 11 (or the substrate for adjustment 30) are in the conjugated positional relation, the region corresponding to the slit 16a of the visual field diaphragm 16 is illuminated by the illumination light L1 on the surface of the substrate 11 (or the substrate for adjustment 30). That is, on the surface of the substrate 11 (or the substrate for adjustment 30), an image of the slit 16a is projected by the function of the illuminating relay lens 17 and first objective lens 19.

Then, from the region of the substrate 11 (or the substrate for adjustment 30) irradiated with the illumination light L1 having a predetermined wavelength band, diffracted light L2 is emitted. The diffracted light L2 includes zeroth order diffracted light (that is, reflected light), ± primary diffracted light, and the like. Wavelength properties of the diffracted light L2 is, in the substrate for adjustment 30, identical for the outer mark 31 and the inner mark 32 of the adjustment mark 30A, and are approximately identical to that of the illumination light L1. In the substrate 11 (a general substrate product), it differs in accordance with the structure or physical properties of the resist mark and underlying mark of the superposition mark 11A. This is because the reflection property of a mark varies in accordance with the structure or physical properties of the mark. The diffracted light L2 from the substrate 11 (or the substrate for adjustment 30) is guided to a later-described optical imaging system (19 to 24).

The optical imaging system (19 to 24) is constituted of the first objective lens 19, a second objective lens 20, a first imaging relay lens 21, a parallel flat plate 22, an imaging aperture stop 23 and a second imaging relay lens 24 sequentially arranged along the optical axis O2. The optical axis O2 of the optical imaging system (19 to 24) is parallel to the Z direction. Between the first objective lens 19 and the second objective lens 20, the beam splitter 18 of the illuminating optical system (13 to 19) is arranged, and between the second objective lens 20 and the first imaging relay lens 21, a beam splitter 41 of the focus detecting section (41 to 48) is arranged. Beam splitters 18, 41 are half prisms for amplitude separation of light.

The first objective lens 19 collimates the diffracted light L2 from the substrate 11 (or the substrate for adjustment 30). The diffracted light L2 collimated by the first objective lens 19 passes through the beam splitter 18 and enters the second objective lens 20. The second objective lens 20 condenses the diffracted light L2 from the beam splitter 18 onto a primary imaging surface 10a.

In the beam splitter 41 of the focus detecting section (41 to 48) arranged on a posterior stage of the primary imaging surface, the reflection/transmission surface is tilted in around 45° relative to an optical axis O3 of the focus detecting section (41 to 48) and the optical axis O2 of the optical imaging system (18 to 24). The beam splitter 41 transmits a part (L3) of the diffracted light L2 from the second objective lens 20 and reflects a part (L4) of the remains. The part of the light, L3, passing through the beam splitter 41 is guided to the first imaging relay lens 21 of the optical imaging system (18 to 24). The first imaging relay lens 21 collimates the light L3 from the beam splitter 41.

Figure 3:
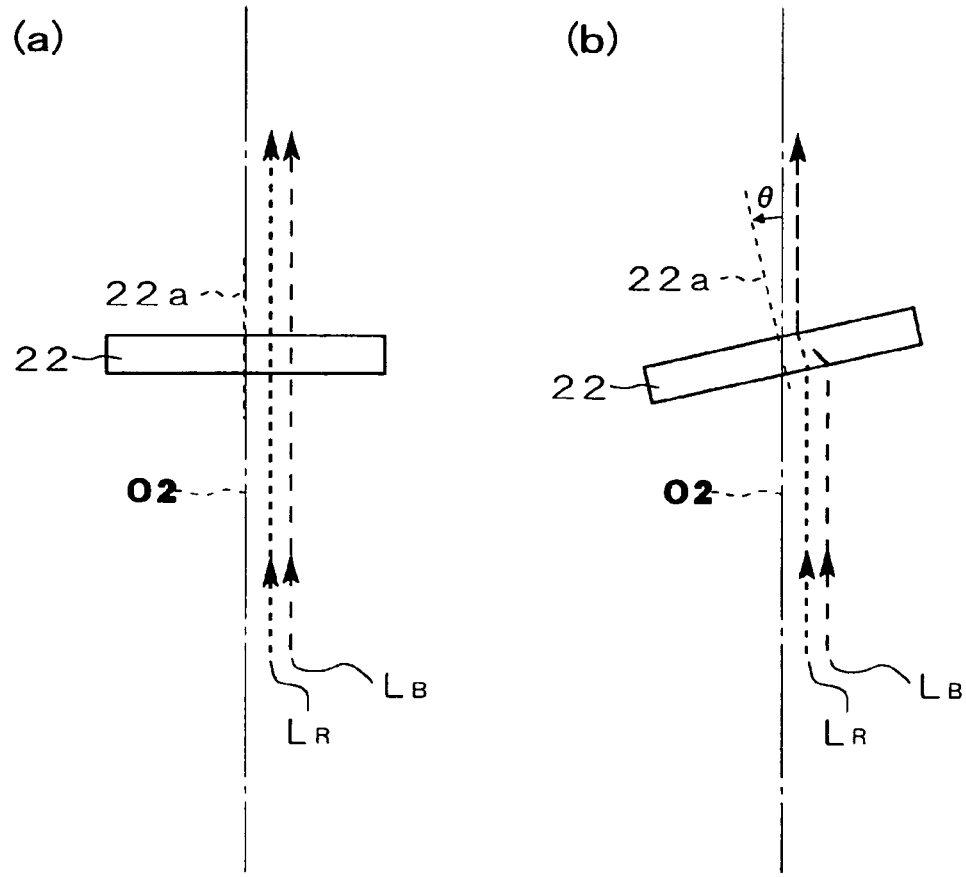
FIG. 3 illustrates fine adjustment of arrangement of a parallel flat plate 22.

The parallel flat plate 22 is tiltable in a range of several degrees while determining two axes (which are parallel to the X axis and Y axis respectively) vertical to the optical axis O2 as the center. That is, the arrangement of the parallel flat plate 22 is finely adjustable in the tilt direction. FIG. 2 shows fine adjustment in the tilt direction while determining an axis parallel to the X axis as the center. As shown in FIG. 3, a direction inclining an optical axis 22a of the parallel flat plate 22 (an axis parallel to the thickness direction) relative to the optical axis O2 corresponds to the tilt direction. The fine adjustment of tilt direction of the arrangement of the parallel flat plate 22 corresponds to the fine adjustment of a tilt angle θ of the parallel flat plate 22.

As described above, the parallel flat plate 22 can be finely adjusted in the arrangement thereof in the tilt direction (details will be described later), and transmits the light from the first imaging relay lens 21. The imaging aperture stop 23 is arranged on the surface conjugated with the virtual pupil plane 19A of the first objective lens 19, and limits the diameter of the light from the parallel flat plate 22 to a specified diameter. The second imaging relay lens 24 reimages the light from the imaging aperture stop 23 on the image pickup surface (secondary imaging surface) of the CCD image pickup device 25.

In the above-described optical imaging system (18 to 24), when the superposition mark 11A on the substrate 11 (or the adjustment mark 30A on the substrate for adjustment 30) has been positioned in the viewing region, the image of the mark is formed on the image pickup surface of the CCD image pickup device 25. Further, the parallel flat plate 22 arranged between the virtual pupil plane 19A of the first objective lens 19 and the arranged face of the imaging aperture stop 23 (hereinafter, aperture stop surface 23A) can be finely adjusted in the tilt direction, and the optical imaging system (18 to 24) is adjusted using the parallel flat plate 22 (details will be described later).

The CCD image pickup device 25 is arranged so that the image pickup surface thereof coincides with the image surface of the optical imaging system (18 to 24). The CCD image pickup device 25 is an area sensor in which plural pixels are two-dimensionally disposed, takes an image of the superposition mark 11A on the substrate 11 (or the adjustment mark 30A on the substrate for adjustment 30), and outputs the image signal to an image processing section 26. The image signal indicates the distribution concerning luminance values (luminance distribution) for respective pixels on the image pickup surface of the CCD image pickup device 25.

Based on the image signal from the CCD image pickup device 25, the image processing section 26 captures an image of the superposition mark 11A on the substrate 11 (or the adjustment mark 30A on the substrate for adjustment 30), and performs predetermined image processing on the image. Incidentally, an image processing for superposition inspection is performed on the image of the superposition mark 11A. On the image of the adjustment mark 30A, in order to obtain an index of finely adjusting the arrangement of the parallel flat plate 22 in the tilt direction, a predetermined image processing (described later) is performed. Visual observation with a television monitor (not shown) is also possible via the image processing section 26.

Next, the focus detecting section (41 to 48) will be described. The focus detecting section (41 to 48) is a section for detecting whether or not the substrate 11 (or the substrate for adjustment 30) on the stage 12 is in a focused state relative to the image pickup surface of the CCD image pickup device 25.

The focus detecting section (41 to 48) is constituted of an optical system composed of the beam splitter 41, an AF first relay lens 42, a parallel flat plate 43, a pupil splitting mirror 44, an AF second relay lens 45 and a cylindrical lens 46, an AF sensor 47, and a signal processing section 48, sequentially arranged along the optical axis O3. The AF sensor 47 is a line sensor, and in an image pickup surface 47a thereof, plural pixels are one-dimensionally aligned. The cylindrical lens 46 has refracting power in the direction perpendicular to the alignment direction (the A direction in the drawing) of pixels in an image pickup surface 47a of the AF sensor 47.

In the focus detecting section (41 to 48), a part of the light, L4 (hereinafter, referred to as AF light), having been reflected from the beam splitter 41 is collimated by the AF first relay lens 42, passes through the parallel flat plate 43, and enters the pupil splitting mirror 44. On the pupil splitting mirror 44, an image of the illumination aperture stop 14 of the illuminating optical system (13 to 19) is formed. The parallel flat plate 43 is an optical element for positionally adjusting the image of the illumination aperture stop 14 to the center of the pupil splitting mirror 44, and has a mechanism capable of tilt adjustment.

The AF light entered the pupil splitting mirror 44 is subjected to amplitude separation into lights in two directions, and then condensed near the image pickup surface 47a of the AF sensor 47 through the AF second relay lens 45 and the cylindrical lens 46. At this time, on the image pickup surface 47a, two images of the visual field diaphragm 16 are formed for measurement direction at separate positions along the alignment direction of the pixel (the A direction in the drawing).

Then, the AF sensor 47 outputs a light receiving signal concerning the imaging center of two images formed on the image pickup surface 47a to a signal processing section 48.

Based on the output from the AF sensor 47, the signal processing section 48 calculates the distance between the imaging centers of two images of the visual field diaphragm 16 for the measurement direction, obtains the difference from the distance in the focused state pre-stored, and outputs a focus signal to a stage controlling section 27. A detail of such AF actions of pupil splitting method is described in, for example, Japanese Unexamined Patent Application Publication No. 2002-40322.

Meanwhile, when arranging respective optical elements of the optical imaging system (18 to 24) in the superposition measuring device 10 (FIG. 1) constituted as described above, respective optical elements are fixed with metallic material, and the block is arranged parallel relative to the optical axis O2 while adjusting them with such instrument as a collimator. However, respective optical elements may have an eccentric error due to machining accuracy of the block or adjustment error.

Figure 4:
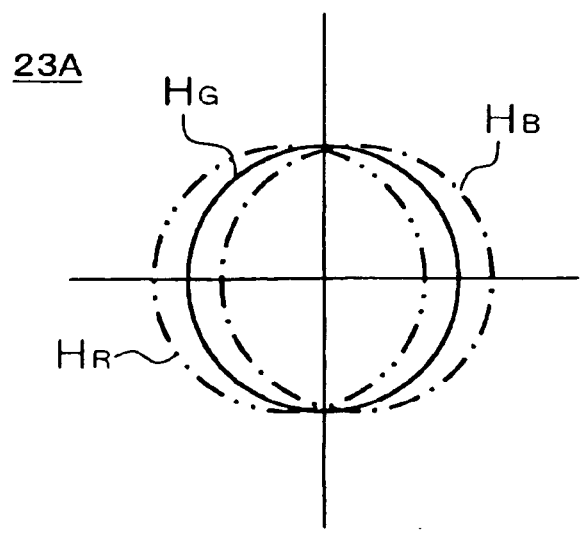
FIG. 4 illustrates imaging positional deviation of pupil images HR, HG, HB on an aperture stop surface 23A in accordance with the wavelength band.

When an eccentric error of the optical element occurs between the virtual pupil plane 19A of the optical imaging system (18 to 24) and the aperture stop surface 23A, the eccentric error causes imaging positions of the pupil image on the aperture stop surface 23A to be differentiated depending on the wavelength band. FIG. 4 shows a schematic illustration of the positional relation of pupil images in such case. FIG. 4 shows a positional relation of a pupil image HG corresponding to the central wavelength band, a pupil image HB corresponding to the short wavelength band, and a pupil image HR corresponding to the long wavelength band. The pupil images HR, HG and HB in FIG. 4 are components of the same refraction order (for example, zeroth order refraction component) out of the diffracted light L3 entering the imaging aperture stop 23A.

Figure 5:
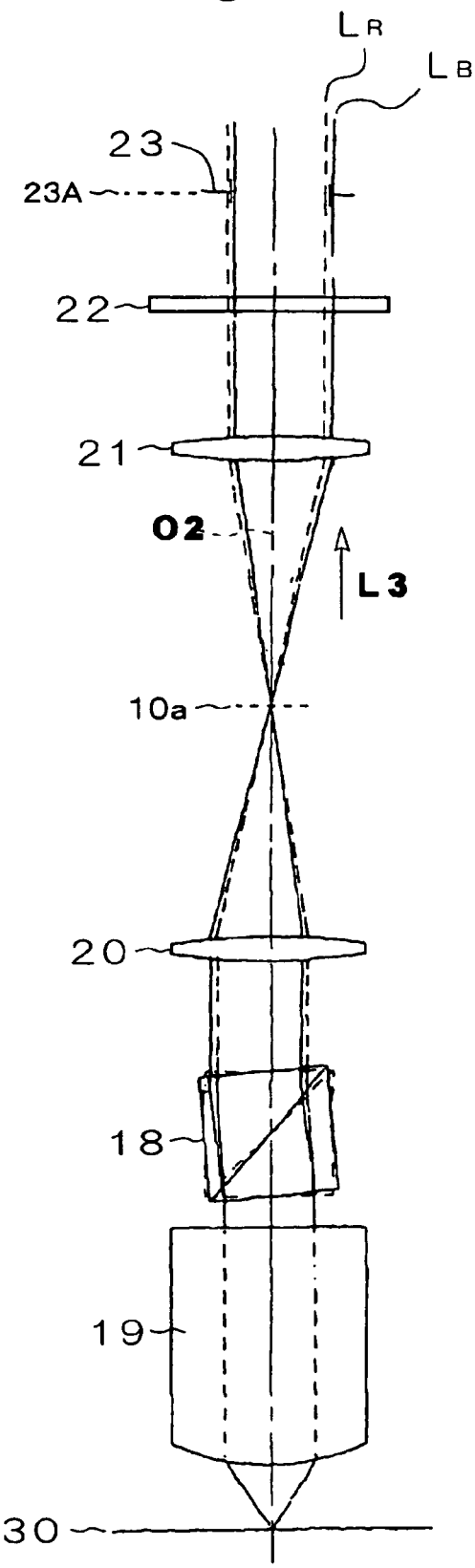
FIG. 5 illustrates imaging positional deviation on the aperture stop surface 23A caused by the eccentric error (tilt error) of a beam splitter 18.
Figure 6:
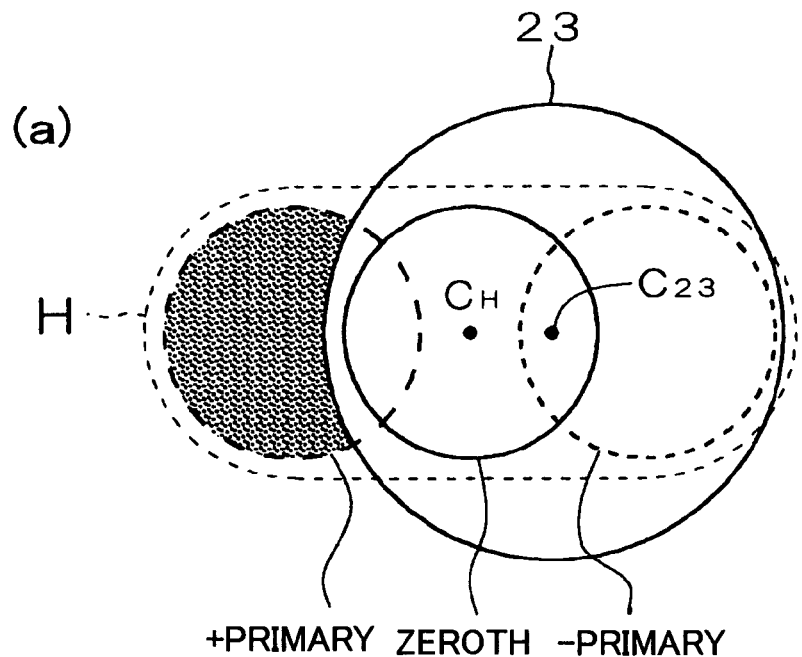
FIG. 6 illustrates the case where vignetting is asymmetric (only light volume of + primary diffraction components lowers)
Figure 6:
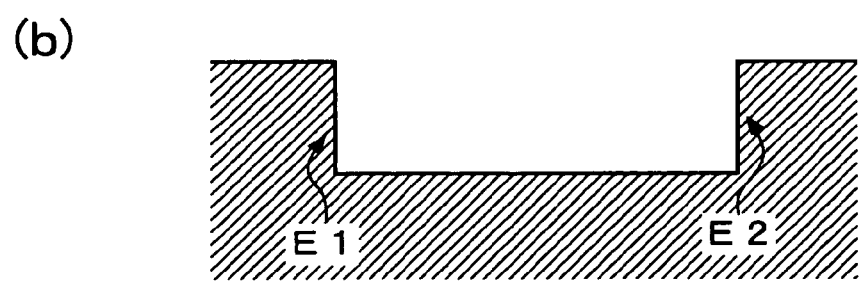
Figure 6:
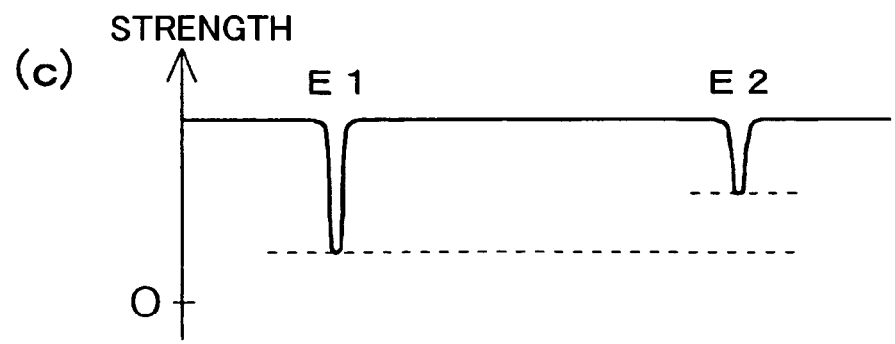

As one example of the case where imaging positional deviation (FIG. 4) of pupil images HR, HG and HB on the aperture stop surface 23A is induced, an eccentric error (tilt error) of the beam splitter 18 as shown in FIG. 5 may be considered. In FIG. 5, showing of the beam splitter 41 is omitted out of optical elements on the optical axis O2, and a tilt angle θ of the parallel flat plate 22 is set to 0 (the same as FIG. 3(a)). Further, in FIG. 5, the light path of the diffracted light LB of the short wavelength band and the light path of the diffracted light LR of the long wavelength band are shown separately, out of the diffracted light L3.

As is understood from FIG. 5, for example, when the beam splitter 18 has an eccentric error, if the parallel flat plate 22 is not finely adjusted (that is, when the tilt angle θ is set to 0), the diffracted light LB of the short wavelength band and the diffracted light LR of the long wavelength band enter the aperture stop surface 23A in a fixed state of the positional deviation, to cause imaging positional deviation of pupil images HR, HG and HB on the aperture stop surface 23A (FIG. 4). As well as the case of the beam splitter 18, the case where the second objective lens 20, the beam splitter 41 or the first imaging relay lens 21 has an eccentric error gives the same result.

In addition, different imaging positions of pupil images HR, HG and HB on the aperture stop surface 23A depending on the wavelength bands (FIG. 4) leads to different symmetric/asymmetric properties of vignetting for each wavelength band when the diffracted light L3 of respective wavelength bands passes through the imaging aperture stop 23 arranged there. For example, when vignetting of the central wavelength band is symmetric, asymmetric vignetting is resulted in for both of the short wavelength band and the long wavelength band.

The case where vignetting is asymmetric is a case where the position of the center CH of the pupil image H is misaligned relative to the center C23 of the imaging aperture stop 23, as shown in FIG. 6(a). In FIG. 6(a), zeroth order diffraction component and ± primary diffraction components are exemplified. In the case of FIG. 6(a), out of the pupil image H, a part of the + primary diffraction component (dot hatched portion) is interrupted by the imaging aperture stop 23 to be vignetting, but − primary diffraction component is not limited by the imaging aperture stop 23. Consequently, the vignetting is asymmetric with regard to the center CH of the pupil image H.

On the contrary, as shown in FIG. 7(a), vignetting is symmetric when the position of center CH of the pupil image H coincides with the center C23 of the imaging aperture stop 23. In FIG. 7(a), the zeroth order diffraction component and ± primary diffraction components of the pupil image H are also exemplified. In the case of FIG. 7(a), a part of the + primary diffraction component and a part of the − primary diffraction component (dot hatched portions) are interrupted by the imaging aperture stop 23 in the same amount to form vignetting. Therefore, vignettings is symmetric with regard to the center CH of the pupil image H.

In addition, when considering the diffracted light L3 after passing through the imaging aperture stop 23, the case where the vignetting is asymmetric (FIG. 6(a)) does not result in alteration of the light amount of the zeroth order diffraction component and the − primary diffraction component, but leads to lowering of the light amount of the + primary diffraction component. That is, compared to the − primary diffraction component, the light amount of the + primary diffraction component is smaller. Thus, when the diffracted light L2 is emitted from a mark having a concavity/convexity structure as shown in FIG. 6(b) arranged on the object surface of the optical imaging system (19 to 24), the light amount of the + primary diffraction component is smaller than that of the − primary diffraction component, and difference occurs in the imaging state of right and left edge images.

Further, with occurrence of such asymmetric property of the diffracted light L2 as described above, two edges E1, E2 of the mark appear differently as shown in FIG. 6(b). As the result, the intensity profile of images of the edges E1, E2 formed on the image pickup surface of the CCD image pickup device 25 via the optical imaging system (18 to 24) includes such distortion (unbalance of right and left) as shown in FIG. 6(c). In this case, the position of the mark shown in FIG. 6(b) detected according to an image signal from the CCD image pickup device 25 includes an error component (TIS value) in accordance with the unbalance of right and left edge images.

On the other hand, about the diffracted light L3 after passing through the imaging aperture stop 23, when vignetting is symmetric (FIG. 7(a)), the light amount of the zeroth order diffraction component does not change, but the − primary diffraction component and the + primary diffraction component lower by the same amount.

Further, when such symmetric property of the diffracted light L2 as described above is maintained, the vision of two edges E1, E2 of the mark shown in FIG. 7(b) becomes equal.

That is, one edge E1 can be clearly seen by assuring the light amount of the − primary diffraction component, and the other edge E2 can be clearly seen by assuring the light amount of the + primary diffraction component. Consequently, the intensity profile of images of edges E1, E2 formed on the image pickup surface of the CCD image pickup device 25 via the optical imaging system (18 to 24) becomes equal on right and left (balanced) as shown in FIG. 7(c). In this case, detection of the position of the mark shown in FIG. 7(b) based on an image signal from the CCD image pickup device 25 can give an accurate detection result not including an error component (TIS value).

Accordingly, as described above, when imaging positions of pupil images HR, HG and HB on the aperture stop surface 23A differ depending on wavelength bands (FIG. 4), symmetric/asymmetric property of the vignetting differs for respective wavelength bands (FIG. 6(a), FIG. 7(a)), and therefore even for images of edges E1, E2 of the same mark (FIG. 6(b), FIG. 7(b)), the intensity profile thereof (FIG. 6(c), FIG. 7(c)) is led to have different balance/unbalance of right and left for respective wavelength bands. For example, when vignetting of the central wavelength band is symmetric and vignetting of the long wavelength band or the short wavelength band is asymmetric, the intensity profile of the edge image of the former becomes as shown in FIG. 7(c), and the intensity profile of the edge image of the latter becomes as shown in FIG. 6(c).

As the result, although accurate detection result of the mark position can be obtained for the central wavelength band that results in symmetric vignetting, in the case of the long wavelength band or the short wavelength band that results in asymmetric vignetting, an inaccurate detection result of the mark position is given including an error component (TIS value).

Incidentally, when the asymmetric property of vignetting in the long wavelength band has directional property as shown in FIG. 6(a), the asymmetric property of vignetting in the short wavelength band has an inverted directional property as shown in FIG. 8(a). And the light amount of respective components of the diffracted light L2 occurring from the mark and the intensity profile of images of edges E1, E2 become shown in FIG. 8(b), (c).

Consequently, an error component (TIS value) of the detected result of the mark position in the short wavelength band has an inverted directional property relative to an error component (TIS value) of the detected result of the mark position in the long wavelength band.

Next, an adjusting method of the optical imaging system (18 to 24) of the embodiment will be described. The optical imaging system (18 to 24) is adjusted in order to correct imaging positional deviation (FIG. 4) of pupil images HR, HG and HB on the aperture stop surface 23A in accordance with the wavelength bands to form pupil images HR, HG and HB at the same imaging position (for example, the position in FIG. 7) irrespective of the wavelength band. For this adjustment, the substrate for adjustment 30 shown in FIG. 2, and the parallel flat plate 22 arranged between the virtual pupil plane 19A of the optical imaging system (18 to 24) and the aperture stop surface 23A are used.

The adjustment mark 30A provided to the substrate for adjustment 30 (FIG. 2) is constituted of, as described above, the outer mark 31 and the inner mark 32, wherein the pitch P1 of the outer mark 31 is, for example, 3.8 μm, and the pitch P2 of the inner mark 32 is, for example, 1 μm. When denoting numerical aperture of the illuminating optical system (13 to 19) as NAill, numerical aperture of the optical imaging system (19 to 24) as NAima, and the central wavelength of the illumination light L1 as λ (μm), such pitches P1, P2 satisfy the following conditional equations (1) to (3):

$$NAima > NAill \tag{1}$$

$$NAima - 1.2 \times NAill = \lambda/P1 \tag{2}$$

$$NAima + NAill/2 = \lambda/P2 \tag{3}$$

When the conditional equation (1) is satisfied, the size of the pupil image H on the aperture stop surface 23A of the optical imaging system (19 to 24) (see FIGS. 6 to 8) is smaller than that of the imaging aperture stop 23 for respective components.

The conditional equation (2) relates to the outer mark 31 of the adjustment mark 30A. When the conditional equation (2) is satisfied, as shown in FIG. 9(a), for the pupil image H31 of the outer mark 31 at the wavelength of λ on the aperture stop surface 23A, all of the zeroth order diffraction component and ± primary diffraction components enter the inside of the imaging aperture stop 23 with sufficient margin. FIG. 9(a) shows the positional relation when the position of the center CH of the pupil image H31 coincides with the center C23 of the imaging aperture stop 23.

In addition, when the conditional equation (2) is satisfied, even if there is an imaging positional deviation of pupil images HR, HG and HB for respective wavelength bands, it is possible to allow all of the zeroth diffraction component and ± primary diffraction components to enter the inside of the imaging aperture stop 23 irrespective of wavelength bands. In other words, as to the outer mark 31, symmetric property of the vignetting can be maintained not only for the central wavelength λ, but also for either of the long wavelength band or short wavelength band of the illumination light L1 (see FIG. 7).

On the other hand, the conditional equation (3) relates to the inner mark 32 of the adjustment mark 30A. When the conditional equation (3) is satisfied, as to the pupil image H32 of the inner mark 32 on the aperture stop surface 23A at the wavelength λ, as shown in FIG. 9(b), the zeroth order diffraction component enters the inside of the imaging aperture stop 23 and the ± primary diffraction components enter the outside of the imaging aperture stop 23. FIG. 9(b) shows a positional relation when the position of the center CH of the pupil image H32 coincides with the center C23 of the imaging aperture stop 23. In this case, symmetric property of the vignetting is maintained.

Figure 8:
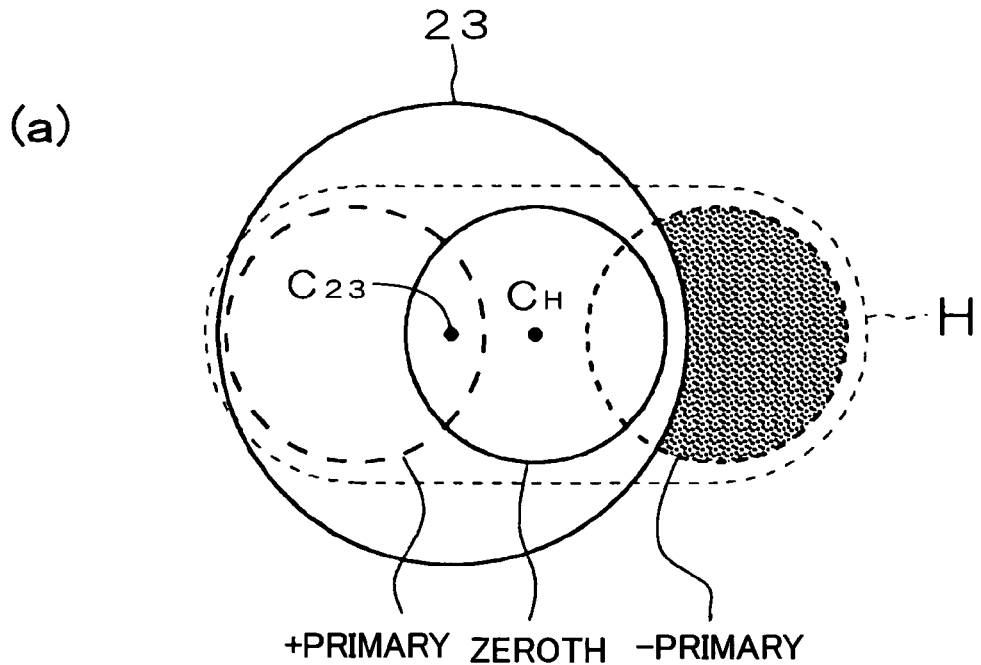
FIG. 8 illustrates the case where vignetting is asymmetric (light volume of − primary diffraction components alone lowers)
Figure 8:
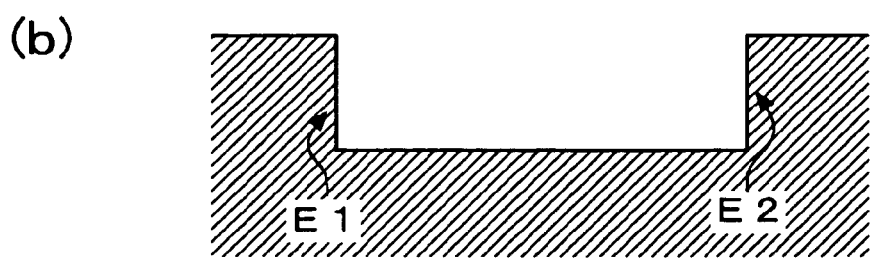
Figure 8:
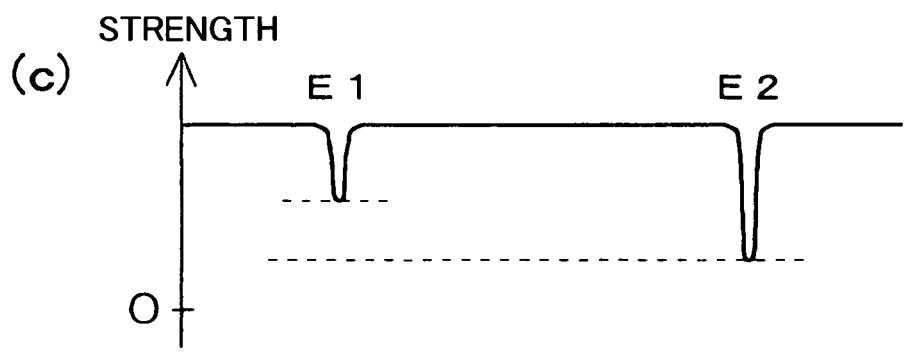
Figure 9:
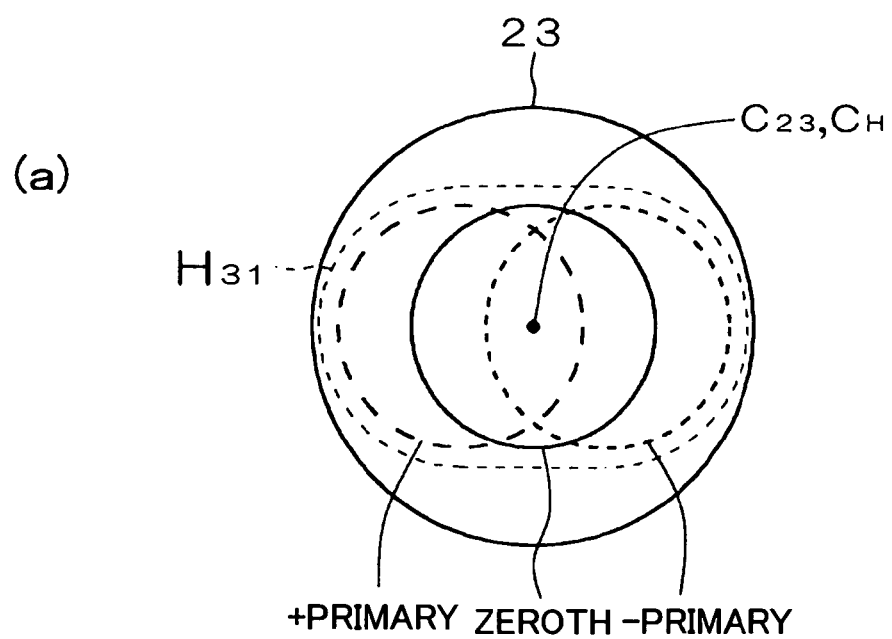
FIG. 9(a) shows the positional relation between an imaging aperture stop 23 and a pupil image H31 of an outer mark 31.
FIG. 9(b) shows the positional relation between an imaging aperture stop 23 and a pupil image H32 of an inner mark 32.
Figure 9:
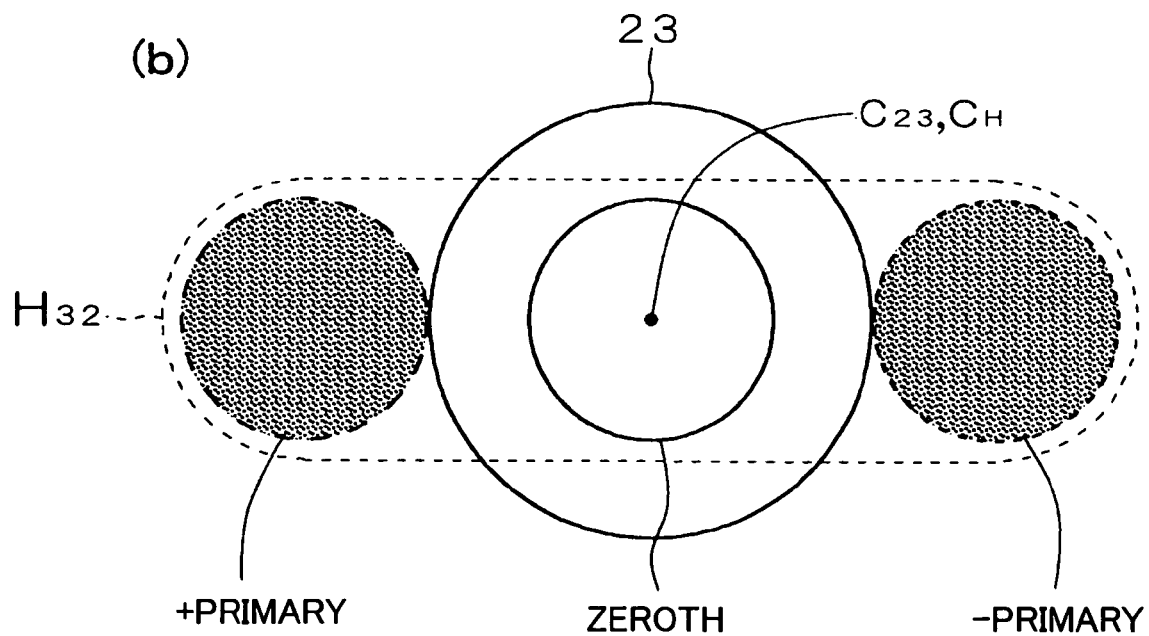
Figure 10:
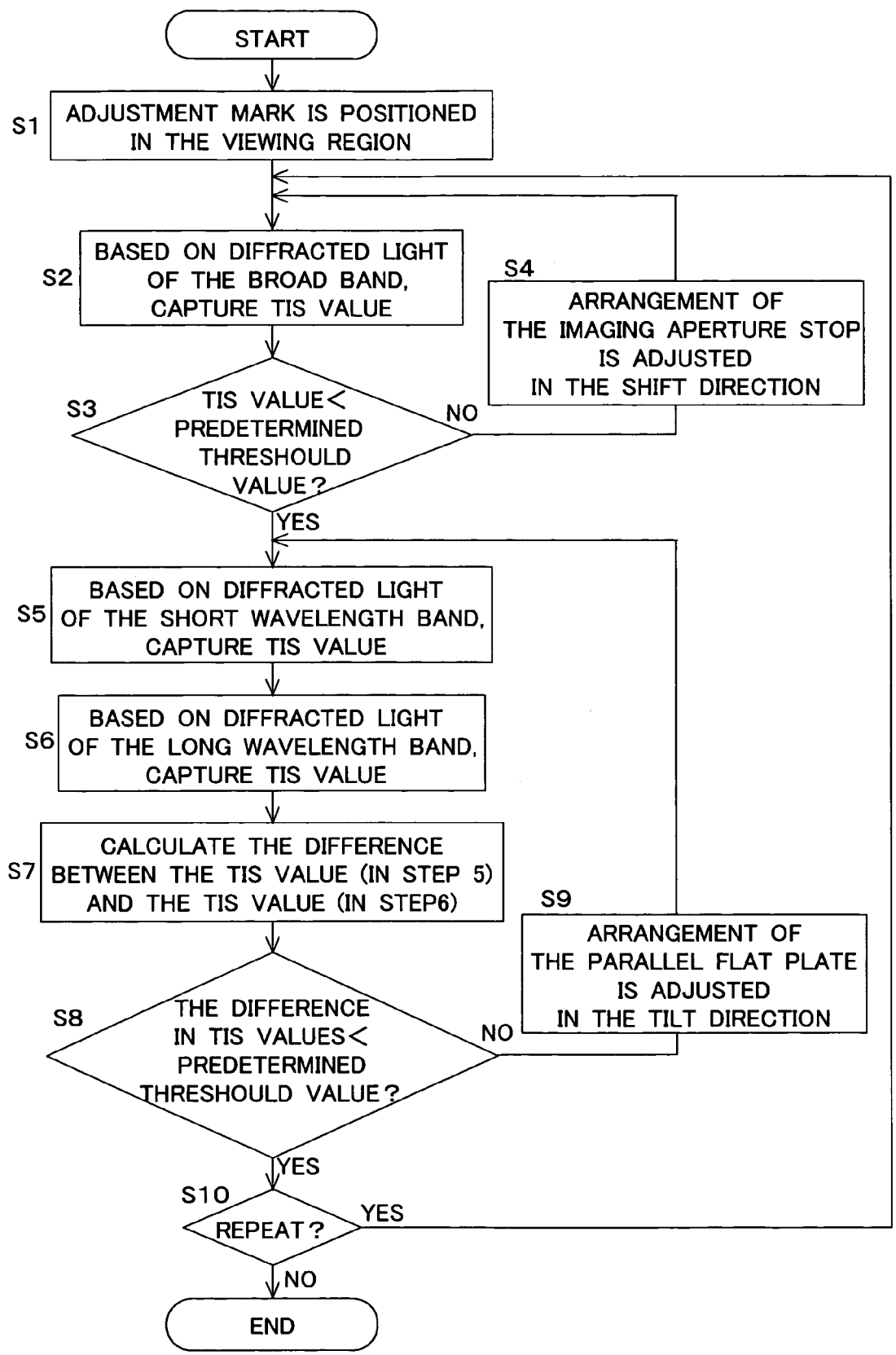
FIG. 10 is a flow chart showing an adjustment procedure of an optical imaging system (19 to 24) according to a first embodiment.

In addition, when the conditional equation (3) is satisfied, if there is imaging positional deviation of the pupil images HR, HG and HB for respective wavelength bands as shown in FIG. 4, for the long wavelength band, the center CH of the pupil image H32 shifts to left in the drawing from the center C23 of the imaging aperture stop 23 (see FIG. 6); and for the short wavelength band, contrarily, the center CH of the pupil image H32 shifts to right in the drawing from the center C23 of the imaging aperture stop 23 (see FIG. 8). Therefore, the symmetric property of vignetting is degraded to become asymmetric.

In the method of adjusting the optical imaging system (18 to 24) of the embodiment, an index upon adjusting the optical imaging system (19 to 24) is searched while adding symmetric/asymmetric property of vignetting for respective wavelength bands in the inner mark 32 as described above, and, based on the index, the arrangement of the parallel flat plate 22 is finely adjusted in the tilt direction (see FIG. 3). The optical imaging system (18 to 24) is adjusted according to the flow chart in FIG. 10.

In Step S1, the substrate for adjustment 30 is placed on a holder of a stage 12, and the adjustment mark 30A is positioned in the viewing region of the superposition measuring device 10. After the positioning, AF action is performed based on a focus signal from the focus detecting section (41 to 48) to focus the adjustment mark 30A relative to the image pickup surface of the CCD image pickup device 25. That is, the adjustment mark 30A is arranged on the object surface of the optical imaging system (19 to 24).

In Step S2, the adjustment mark 30A is irradiated with illumination light L1 having a broad band (for example, wavelength width is around 270 nm), and, based on diffracted light L2 having a broad band emitted from the adjustment mark 30A, a mark image is captured. The mark image is captured before and after rotating the adjustment mark 30A by 180°. Then, based on luminance information of two mark images, positional deviation amounts of the outer mark 31 and the inner mark 32 are calculated respectively.

Further, according to a following formula (4), an average value of a positional deviation amount L0 in 0° direction (initial state) and a positional deviation amount L180 in 180° direction is calculated as a TIS value. The TIS value represents positional deviation between the center CH of the pupil image at the central wavelength λ of a broad band (including pupil images of a long wavelength band and short wavelength band, in addition to the pupil image H31 and pupil image H32 at the central wavelength λ shown in FIG. 9) and the center C23 of the imaging aperture stop 23 on the aperture stop surface 23A.

$$TIS=(L0+L180)/2 \qquad (4)$$

In Step S3, the TIS value calculated in Step 2 (that is, positional deviation of the center CH of the pupil image at the central wavelength λ) is compared with a predetermined threshold value. The threshold value is a sufficiently small standardized value.

When the TIS value is larger than the threshold value (S3 is No), while using the TIS value as an index, the arrangement of the imaging aperture stop 23 is finely adjusted in the shift direction (Step S4). After that, the processing returns to Step 2. The above-described processing of Steps S2 to S4 is repeated until the TIS value (positional deviation of the center CH of the pupil image at the central wavelength λ) becomes smaller than the threshold value (S3 becomes Yes).

When the TIS value calculated in Step S2 has become smaller than the threshold value, the center CH of the pupil image at the central wavelength λ and the center C23 of the imaging aperture stop 23 approximately has coincided with each other, as shown in FIGS. 9(a) and 9(b). In this case, vignetting at the central wavelength λ becomes symmetric with regard to the outer mark 31 and the inner mark 32 of the adjustment mark 30A. The symmetric property of vignetting of the outer mark 31 is caused by entering of all of the ± primary diffraction components of the pupil image H31 inside the imaging aperture stop 23, and the symmetric property of vignetting of the inner mark 32 is caused by entering of all of the ± primary diffraction components of the pupil image H32 outside the imaging aperture stop 23.

In the subsequent Step S5, the wavelength band of the illumination light L1 is changed, the illumination light L1 having a short wavelength band is irradiated to the adjustment mark 30A, and, at this time, the mark image is captured based on diffracted light L2 of the short wavelength band emitted from the adjustment mark 30A. The diffracted light L2 of the short wavelength band includes light emitted with a spread angle corresponding to the pitch P1 of the outer mark 31 and light emitted with a spread angle corresponding to the pitch P2 of the inner mark 32. Then, based on light passing through the imaging aperture stop 23 and reaching the image surface of the optical imaging system (19 to 24) out of the diffracted light L2, the mark image is captured.

When there is an imaging positional deviation of pupil images HR, HG and HB corresponding to respective wavelength bands as shown in FIG. 4, a pupil image of the outer mark 31 by the diffracted light L2 of the short wavelength band shifts in right direction in the drawing compared with the pupil image H31 at the central wavelength λ as shown in FIG. 9(a), but, since the above-described conditional equation (2) is satisfied, the – primary diffraction component does not run over to the outside of the imaging aperture stop 23. Therefore, as to the outer mark 31, the symmetric property of vignetting can be maintained even for the short wavelength band. In this case, the luminance information of the outer mark 31 of the mark image has identical intensity profiles on right and left (see FIG. 7(c)).

On the other hand, since the instance of the inner mark 32 satisfies the above-described conditional equation (3), a pupil image caused by the diffracted light L2 of the short wavelength band shifts in the right direction in the drawing compared with the pupil image H32 at the central wavelength λ shown in FIG. 9(b), and a part of the + primary diffraction component enters the inside of the imaging aperture stop 23. That is, a vignetting amount of the + primary diffraction component decreases and a vignetting amount of the – primary diffraction component does not vary. Therefore, for the inner mark 32, vignetting is led to be asymmetric in the short wavelength band. In this case, the luminance information of the inner mark 32 of the mark image includes distortion (unbalance on right and left) in the intensity profile thereof (see FIG. 6(c)).

A mark image is also captured with the illumination light L1 of the short wavelength band before and after rotating the adjustment mark 30A by 180°. Then, based on luminance informations of two mark images, while adding symmetric/asymmetric property of the luminance information concerning the outer mark 31, and also adding symmetric/asymmetric property of the luminance information concerning the inner mark 32, respective positional deviation amounts of the outer mark 31 and the inner mark 32 are calculated. Further, according to the above-described formula (4), an average value of a positional deviation amount L0 in the 0° direction and a positional deviation amount L180 in the 180° direction is calculated as a TIS value. The TIS value represents positional deviation between the center CH of the pupil image of the short wavelength band on the aperture stop surface 23A and the center C23 of the imaging aperture stop 23.

Further, in Step 6, the wavelength band of the illumination light L1 is changed, and the adjustment mark 30A is irradiated with the illumination light L1 of the long wavelength band, and, based on the diffracted light L2 of the long wavelength band emitted from the adjustment mark 30A, a mark image is captured. The diffracted light L2 of the long wavelength band includes light emitted with a spread angle corresponding to the pitch P1 of the outer mark 31, and light emitted with a spread angle corresponding to the pitch P2 of the inner mark 32. Then, based on light passing through the imaging aperture stop 23 and reaching the image surface of the optical imaging system (19 to 24) out of the diffracted light L2, the mark image is captured.

When there is an imaging positional deviation of pupil images HR, HG and HB for respective wavelength bands shown in FIG. 4, the pupil image of the outer mark 31 caused by the diffracted light L2 of the long wavelength band shifts to left in the drawing relative to the pupil image H31 at the central wavelength λ shown in FIG. 9(a), however, since the conditional equation (2) is satisfied, the + primary diffraction component does not run over to the outside of the imaging aperture stop 23. Therefore, for the outer mark 31, the symmetric property of vignetting can be maintained even in the long wavelength band. In this case, luminance information of the outer mark 31 of the mark image has an identical intensity profile on right and left (see FIG. 7(c)).

On the other hand, in the case of the inner mark 32, since the conditional equation (3) is satisfied, the pupil image caused by the diffracted light L2 of the long wavelength band shifts to left in the drawing relative to the pupil image H32 at the central wavelength λ shown in FIG. 9(b), and a part of the – primary diffraction component enters the inside of the imaging aperture stop 23. That is, a vignetting amount of the – primary diffraction component decreases, and a vignetting amount of + primary diffraction component does not vary. Therefore, in the inner mark 32, the vignetting is led to be asymmetric in the long wavelength band. In this case, the luminance information of the inner mark 32 of the mark image includes distortion (unbalance on right and left) in the intensity profile thereof (see FIG. 8(c)).

The mark image with the illumination light L1 in the long wavelength band is also captured before and after rotating the adjustment mark 30A by 180°. Then, based on the luminance information of two mark images, while adding symmetric/asymmetric property of the luminance information concerning the outer mark 31, and also adding symmetric/asymmetric property of the luminance information concerning the inner mark 32, respective positional deviation amounts of the outer mark 31 and the inner mark 32 are calculated. Further, according to the formula (4), an average value of a positional deviation amount L0 in the 0° direction and a positional deviation amount L180 in the 180° direction is calculated as a TIS value. The TIS value represents positional deviation between the center CH of the pupil image of the long wavelength band on the aperture stop surface 23A and the center C23 of the imaging aperture stop 23.

As can be understood from the description about Steps S5, S6, the asymmetric property of vignetting in the short wavelength band and the asymmetric property of vignetting in the long wavelength band have directional properties inverted with each other. As the result, the TIS value (positional deviation of the center CH of the pupil image of the short wavelength band) calculated in Step 5 and the TIS value (positional deviation of the center CH of the pupil image of the long wavelength band) calculated in Step 6 also have directional properties inverted with each other.

Then, in Step 7, the difference between the TIS value calculated in Step 5 (positional deviation of the center CH of the pupil image of the short wavelength band) and the TIS value calculated in Step 6 (positional deviation of the center CH of the pupil image of the long wavelength band) is calculated. The difference in TIS values represents positional deviation between the center CH of the pupil image of the short wavelength band and the center CH of the pupil image of the long wavelength band on the aperture stop surface 23A.

In Step 8, the difference in TIS values calculated in Step 7 is compared with a predetermined threshold value (a sufficiently small standardized value). Then, when the difference in TIS values is larger than the threshold value (S8 is No), the arrangement of the parallel flat plate 22 is finely adjusted in the tilt direction using the difference in TIS values as an index (Step 4). After that, the processing returns to Step 5. The processing of S5 to S9 is repeated until the difference in TIS values becomes smaller than the threshold value (till S8 becomes Yes).

Positional deviation amounts (positional deviation amount L0 in 0° direction and positional deviation amount L180 in 180° direction) of the outer mark 31 and the inner mark 32 of the adjustment mark 30A sensitively vary depending on the relative positional relation of the imaging aperture stop 23 and the pupil image H. When the TIS value of the adjustment mark 30A is measured, since the property of the inner mark 32 is inverted for respective wavelength bands, variation of the TIS value is large. This means that the difference in TIS values becomes an index that sensitively varies depending on the wavelength band.

When the difference in TIS values calculated in Step 7 is smaller than the threshold value (when S8 is Yes), it can be said that the center CH of the pupil image of the short wavelength band and the center CH of the pupil image of the long wavelength band on the aperture stop surface 23A approximately coincide with each other. In this case, the center CH of the pupil image H31 at the central wavelength λ also approximately coincides with the centers CH of the short wavelength band and long wavelength band. However, when the TIS value in Step 2 is recalculated at this time, it may have deviated from the threshold value (No in S3).

Therefore, the processing of Steps S2 to S9 is repeated to push so that both of the TIS value of Step S2 and the difference in TIS values in Step S7 become smaller than respective threshold values. At the time when both of the TIS value in Step S2 and the difference in TIS values in Step S7 fall within the standardized values (Step S10 is No), the adjustment processing of the optical imaging system (19 to 24) according to the embodiment terminates.

Figure 7:
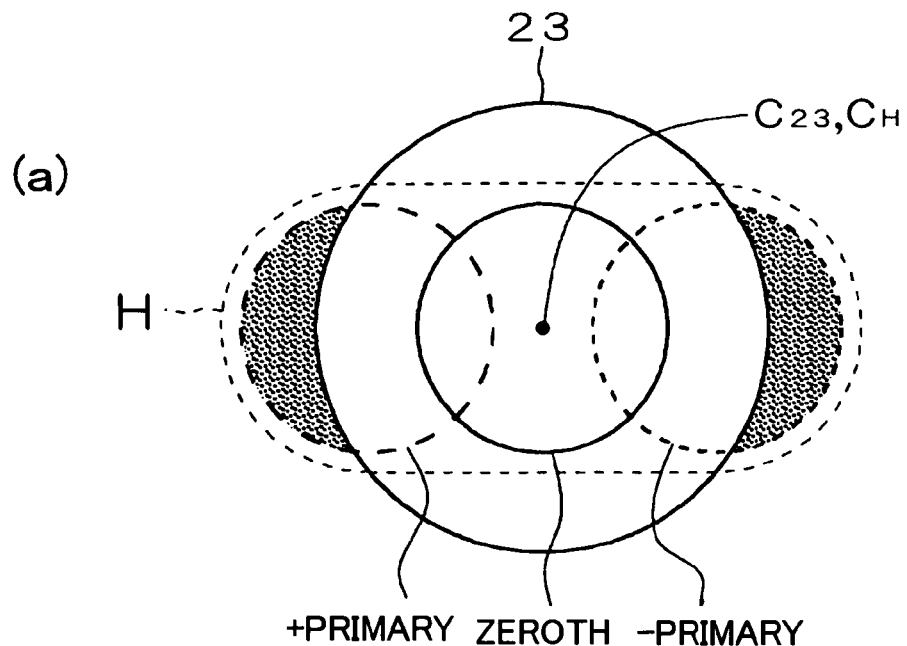
FIG. 7 illustrates the case where vignetting is symmetric.
Figure 7:
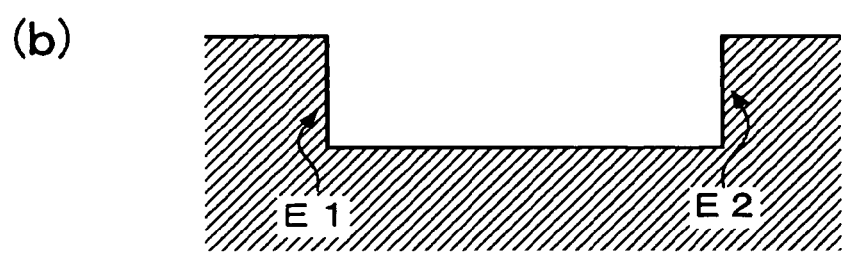
Figure 7:
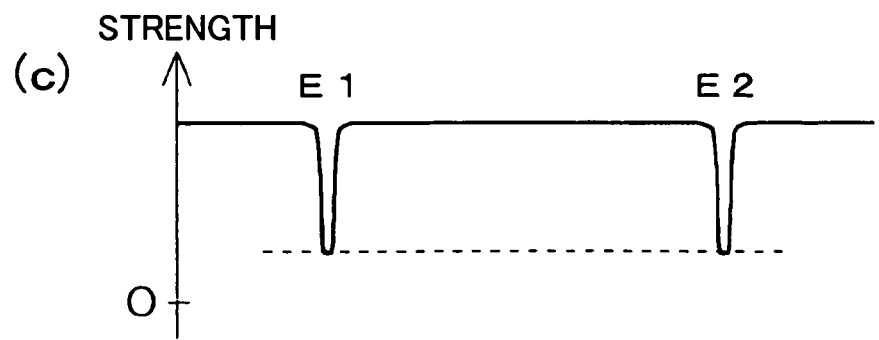

At this time, the imaging positional deviations of pupil images HR, HG and HB on the aperture stop surface 23A in accordance with wavelength bands (FIG. 4) are corrected, and the pupil images HR, HG and HB can be formed at the same imaging position (for example, the position in FIG. 7) irrespective of wavelength bands. Further, irrespective of wavelength bands, vignetting on the aperture stop surface 23A can be maintained in a symmetric state (FIG. 7).

As described above, in the adjusting method of the optical imaging system (19 to 24) according to the embodiment, an index (difference in TIS values) is obtained from an image of the adjustment mark 30A of the substrate for adjustment 30, and the arrangement of the parallel flat plate 22 is finely adjusted in the tilt direction based on the index. Therefore, the arrangement of the parallel flat plate 22 can be finely adjusted sensitively. Consequently, an alignment error (error of the tilt angle θ) of the parallel flat plate 22 can be surely decreased, and an error component (TIS value) resulting from a device can be satisfactorily reduced.

Further, by determining the setting of illuminating wavelength in Step S5 to the shortest wavelength side of the light source 3A, and determining the setting of illuminating wavelength in Step S6 to the longest wavelength side of the light source 3B, an error component (TIS value) caused by a device can be satisfactorily reduced in a wide bandwidth range from a visible light band to a band neighboring infrared light (for example, the range of the wavelength width of around 270 nm).

As the result, upon superposition inspection of the substrate 11 (general substrate product) in the superposition measuring device 10, even when the wavelength property of the diffracted light L2 differs depending on the structure or physical property of the resist mark and the underlying mark of the superposition mark 11A, an accurate value including no error component (TIS value) can be obtained as the detection result of respective mark positions to improve the detection accuracy. Further, a positional deviation amount between the resist mark and the underlying mark can be obtained accurately to make a highly accurate superposition inspection possible.

Modified Example of First Embodiment

The aforementioned embodiment has described an example in which the pitch P1 of the outer mark 31 of the adjustment mark 30A satisfies the conditional equation (2), but the invention is not limited thereto. The invention can be applied to a case where the following conditional equation (5) is satisfied.

$$NAima - NAill > \lambda/P1 \qquad (5)$$

Further, The aforementioned embodiment has described an example in which the pitch P2 of the outer mark 32 of the adjustment mark 30A satisfies the conditional equation (3), but the invention is not limited thereto. The invention can be applied to a case where the S following conditional equation (6) is satisfied.

$$NAima + NAill/2 \leq \lambda/P2 \qquad (6)$$

In the aforementioned embodiment, the pitch P1 of the outer mark 31 is set to be larger than the pitch P2 of the inner mark 32, but the invention is not limited thereto. When pitches P1, P2 of the outer mark 31 and the inner mark 32 differ from each other, the invention can be applied even if the magnitude relation of pitches P1, P2 is reversed.

Furthermore, in the aforementioned embodiment, as shown by conditional equations (2), (3) or conditional equations (5), (6), the pitches P1, P2 of the adjustment mark 30A are determined from the positional relation of ± primary diffraction components of the pupil image H and the imaging aperture stop 23 on the aperture stop surface 23A, but the invention is not limited thereto. Determination of pitches P1, P2 is allowable by using positional relation of ± secondary diffraction components or a higher degree component, in place of ± primary diffraction components, and the imaging aperture stop 23.

The aforementioned embodiment has described an example of the adjustment mark 30A constituted of two types of marks (the outer mark 31 and inner mark 32), but the invention is not limited thereto. The invention can be also applied to a case where the adjustment mark 30A is composed of three types or more of marks having pitches different from one another.

Further, in the aforementioned embodiment, plural marks (for example, the outer mark 31 and inner mark 32) constituting the adjustment mark 30A is constituted of a bar mark, but the invention is not limited thereto. The invention can be applied to a case where another shape (for example, dot shape) is employed. In addition, the adjustment mark 30A is not limited to a duplex mark in which plural marks are arranged in piles so that centers thereof coincide with each other (a mark having a designed positional deviation amount of zero). Plural marks may be arranged side-by-side with a predetermined distance (a designed positional deviation amount ≠0).

The aforementioned embodiment has described an example in which the arrangement of the parallel flat plate 22 is finely adjusted using the difference of error components (TIS value) resulting from the illumination light L1 having different wavelength bands as an index, but the invention is not limited thereto. The invention can be also applied to a case where the arrangement of the parallel flat plate 22 is finely adjusted based on positional deviation amounts resulting from the illumination light L1 having different wavelength bands. At this time, for example, difference in positional deviation amounts may be used as an index.

Further, the aforementioned embodiment has described an example in which the optical imaging system (19 to 24) is adjusted using the parallel flat plate 22, but the invention is not limited thereto. As the optical element for adjustment, in addition, use of two cuneate prisms having different refraction indices may be possible. In this case, by opposing respective inclined planes of two cuneate prisms and sliding the prism (alter the relative position) along the direction perpendicular to the optical axis O2, an effect identical to the tilt adjustment of the parallel flat plate 22 can be obtained.

The aforementioned embodiment has described the adjustment method using the optical imaging system (19 to 24) mounted in the superposition measuring device 10 as an example, but the invention is not limited thereto. The invention can be also applied to a case where an optical imaging system of an optical device for observing an object (for example, an optical microscope and appearance tester) is adjusted.

Second Embodiment

Hereinafter, a second embodiment of the invention will be described in detail using FIGS. 11 to 13.

Here, description will be given using superposition inspection in a production process of a semiconductor device or a liquid crystal display device as an example. A substrate (semiconductor wafer or liquid crystal substrate) as a target for superposition inspection is in a halfway of a process of forming another circuit pattern on an underlying pattern formed in the preceding pattern-forming process (that is, after exposure/development for a resist film and before processing of a material film just under the resist film). The superposition inspection of plural patterns formed on different layers of a substrate (that is, superposition inspection of a resist pattern for an underlying pattern) is performed by detecting positional deviation between the underlying pattern and the resist pattern.

A positional deviation detecting mark 10 in a second embodiment is used in the above-described superposition inspection, and constituted of an underlying mark 10A and a resist mark 10B, as shown in FIGS. 11(a) to 11(c). The underlying mark 10A is a mark on an underlying layer, which has been formed at the same time as the underlying pattern and has a size DA of, for example, about 30 μm. The resist mark 10B is a mark on a resist layer, which has been formed at the same time as the resist pattern and has a size DB of, for example, about 15 μm.

The underlying mark 10A is constituted by cruciately arranging a linear pattern 11 and a linear pattern 12 that is perpendicular to the linear pattern 11. The center CA of the underlying mark 11A corresponds to the intersection point of a linear direction S11 of the linear pattern 11 and a linear direction S12 of the linear pattern 12. The resist mark 11B is constituted by cruciately arranging a linear pattern 13 that is parallel to the linear pattern 11 and a linear pattern 14 that is parallel to the linear pattern 12. The center CB of the resist mark 10B corresponds to the intersection point of the linear pattern 13 and the linear pattern 14, and corresponds to the intersection point of a linear direction S13 of the linear pattern 13 and a linear direction S14 of the linear pattern 14.

In the drawing, although linear patterns 11, 12 are drawn thicker than linear patterns 13, 14, the relation of thicknesses may be different from that in the drawing.

In these underlying mark 10A and the resist mark 10B, when there is no positional deviation between the underlying pattern and the resist pattern, the linear directions S11, S13 of the linear patterns 11, 13 coincide with each other, and the linear directions S12, S14 of the linear patterns 12, 14 coincide with each other. At this time, the center CA of the underlying mark 10A and the center CB of the resist mark 10B also coincide with each other. In the description below, a direction parallel to linear directions S11, S13 of linear patterns 11, 13 is determined to be an λ direction, and a direction parallel to linear directions S12, S14 of linear patterns 12, 14 is determined to be a Y direction.

As to the λ direction of the positional deviation detecting mark 10, the lengths between both ends (corresponding to sizes DA, DB in FIG. 11(a)) of the linear pattern 11 of the underlying mark 10A and the linear pattern 13 of the resist mark 10B differ from each other.

The linear pattern 11 having a longer length between both ends is composed of two separate partial patterns 11(1), 11(2) divided into one side and the other side of the linear direction S11 so that it does not overlap the linear pattern 13 having a shorter length between both ends. The inside distance DE of two partial patterns 11(1), 11(2) is wider than the distance between both ends of the linear pattern 13 (size DB).

In the same way, as to the Y direction of the positional deviation detecting mark 10, the lengths between both ends of the linear pattern 12 of the underlying mark 10A and the linear pattern 14 of the resist mark 10B differ from each other. The linear pattern 12 having a longer length between both ends is composed of two partial patterns 12(1), 12(2) divided into one side and the other side of the linear direction S12 so that it does not overlap the linear pattern 14 having a shorter length between both ends. The inside distance of two partial patterns 12(1), 12(2) is wider than the distance between both ends of the linear pattern 14.

In the above-described positional deviation detecting mark 10, the inside distance DE of the linear pattern 11 (two partial patterns 11(1), 11(2)) of the underlying mark 10A, the inside distance of the linear pattern 12 (two partial patterns 12(1), 12(2)), the distance between both ends of the linear pattern 13 (size DB) of the resist mark 10B, and the distance between both ends of the linear pattern 14 have been optimized so as to have a suitable range for detecting the positional deviation between the underlying pattern and the resist pattern.

In the above-described positional deviation detecting mark 10, each of partial patterns 11(1), 11(2) of the linear pattern 11, partial patterns 12(1), 12(2) of the linear pattern 12, the linear pattern 13, and the linear pattern 14 are constituted of a single pattern (a pattern whose number of the edge is two in the width direction).

Next, a method of detecting the positional deviation (superposition inspection) between the underlying pattern and the resist pattern using the positional deviation detecting mark 10 (the underlying mark 10A and the resist mark 10B) of the second embodiment will be described. Before describing the method, a superposition measuring device 20 shown in FIG. 12 will be described.

As shown in FIG. 12(a), the superposition measuring device 20 is constituted of a stage 22 for supporting a substrate 21, an illumination system (23 to 26) for irradiating the substrate 21 with illumination light L1, an imaging system (25 to 28) for forming an optical image of the substrate 21, a light receiving system (28 to 30) for automatic focusing, an image pickup device 31, an image processing section 32, a system controlling section 33, and a stage controlling section 34. The positional deviation detecting mark 10 in the second embodiment is formed at many pre-designated positions on the surface of the substrate 21 (surface to be inspected).

The stage 22 is constituted of a holder for supporting the substrate 21 while maintaining the same in a horizontal position, and a driving section for moving the holder in horizontal directions (XY direction) and the vertical direction (Z direction) in response to instructions from the stage controlling section 34. By moving the holder of the stage 22 in XY directions, any one of measurement points (positional deviation detecting mark 10 shown in FIG. 11) on the surface to be inspected of the substrate 21 can be positioned just under the objective lens 26 (within a viewing region) of the imaging system (25 to 28). By moving the holder of the stage 22 in the Z direction, focus adjustment is made at the measurement point of the substrate 21. The Z direction corresponds to a direction parallel to the optical axis 6A of the objective lens 26 of the imaging system (25 to 28).

The illumination system (23 to 26) is constituted of a light source 23, an illuminating lens 24, a half prism 25, and an objective lens 26. The light from the light source 23 enters, after passing through the illuminating lens 24, the half prism 25 and the objective lens 26 (illumination light L1), the surface to be inspected of the substrate 21 on the stage 22 (epi-illumination). At this time, the measurement point (positional deviation detecting mark 2010 in FIG. 11) positioned in the viewing region is illuminated with illumination light L1 approximately vertically. Then, reflected light L2 is emitted from the positional deviation detecting mark 10 illuminated with the illumination light L1. The reflected light L2 is guided to the imaging system (25 to 28) and a light receiving system (28 to 30) for automatic focusing.

The imaging system (25 to 28) is constituted of the objective lens 26, the imaging lens 27 and half prisms 25, 28 (an optical microscope section). The imaging lens 27 functions as a second objective lens. The reflected light L2 from the substrate 21 enters, after passing through the objective lens 26, half prisms 25, 28 and the imaging lens 27, the image pickup surface of the image pickup device 31. At this time, on the image pickup surface of the image pickup device 31, an expanded image based on the reflected light L2 (that is, an expanded optical image of the positional deviation detecting mark 10) is formed.

The image pickup device 31 is a black and white area sensor (for example, a CCD camera) in which plural pixels are two dimensionally disposed, images an optical image of the positional deviation detecting mark 10 on the image pickup surface, and outputs the image signal to the image processing section 32 in the subsequent step. The image signal output from the image pickup device 31 is composed of plural sample points and represents distribution about luminance values for respective pixels on the image pickup surface. The luminance value is proportional to intensity of the reflected light L2. The image of the positional deviation detecting mark 10 has a low luminance value at edge portions of the positional deviation detecting mark 10.

The light receiving system (28 to 30) for automatic focusing is constituted of a half prism 28, an imaging lens 29 and a detector 30. The reflected light L2 from the substrate 21 enters the detector 30, after passing through the objective lens 26, half prisms 25, 28 and the imaging lens 29. Then, from the detector 30 to the stage controlling section 34, a focus signal in accordance with a focusing state of the surface to be inspected of the substrate 21 (in particular, a measurement point within the viewing region) is output.

The stage controlling section 34 controls the stage 22 in XY directions and positions one measurement point (positional deviation detecting mark 10 shown in FIG. 11) of the surface to be inspected of the substrate 21, and then controls the stage 22 in the Z direction based on the focus signal from the detector 30 of the light receiving system (28 to 30) to perform the focus adjustment for the measurement point of the substrate 21. Then, after the focus adjustment, the system controlling section 33 that manages and control the whole device controls the image processing section 32 to bring positional deviation detection using the measurement point of the substrate 21 (positional deviation detecting mark 10 shown in FIG. 11) into practice.

Here, when the stage controlling section 34 controls the stage 22 to position the positional deviation detecting mark 10 on the substrate 21 within the viewing region, in principle, the positioning is controlled so that the center of the positional deviation detecting mark 10 (that is, the center CA of the underlying mark 10A or the center CB of the resist mark 10B) stops near the center of the viewing region. The center of the viewing region corresponds to a point on the optical axis 6A of the objective lens 26 of the imaging system (25 to 28).

By allowing the center of the positional deviation detecting mark 10 to approximately coincide with the center of the viewing region (the optical axis 6A of the objective lens 26), the linear directions S11, S12 of the linear patterns 11, 12 of the underlying mark 10A and the linear directions S13, S14 of the linear patterns 13, 14 of the resist mark 10B, respectively, are led to cross with each other in the vicinity of the center of the viewing region.

Both of the linear direction S11 of the linear pattern 11 of the underlying mark 10A and the linear direction S13 of the linear pattern 13 of the resist mark 10B are parallel to one axis (hereinafter X axis) out of two axes (X axis and Y axis shown in FIG. 12(b)) of an orthogonal coordinate system having the origin on the optical axis 6A, and lie near the X axis. In the same way, both of the linear direction S12 of the linear pattern 12 of the underlying mark 10A and the linear direction S14 of the linear pattern 14 of the resist mark 10B are parallel to the other axis (hereinafter Y axis), and lie near the Y axis. Incidentally, the viewing region shown in FIG. 12(b) is regulated by the size of image pickup surface of the image pickup device 31 and the magnifying power of the imaging system (25 to 28).

Figure 11:
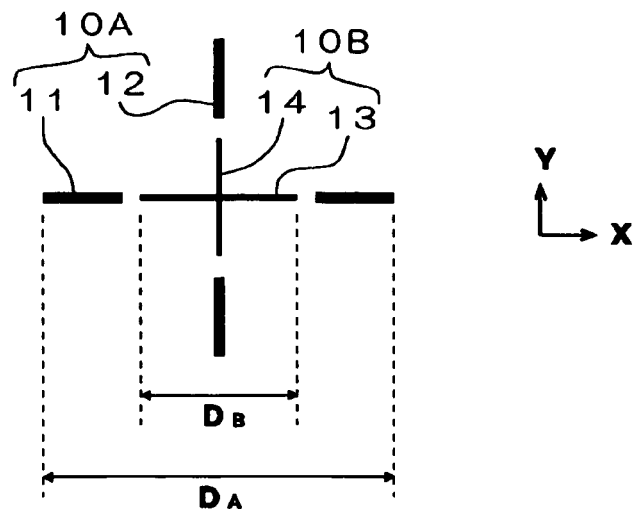
FIG. 11 illustrates the constitution of a positional deviation detecting mark 10 according to a second embodiment.
Figure 11:
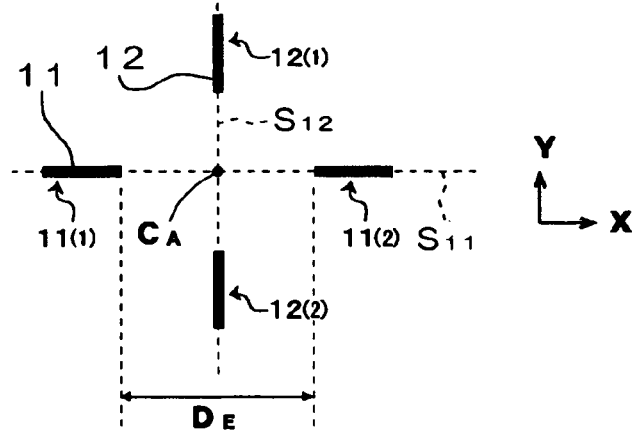
Figure 11:
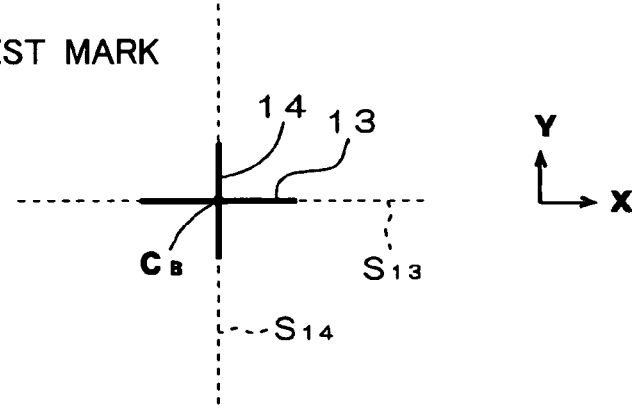
Figure 12:
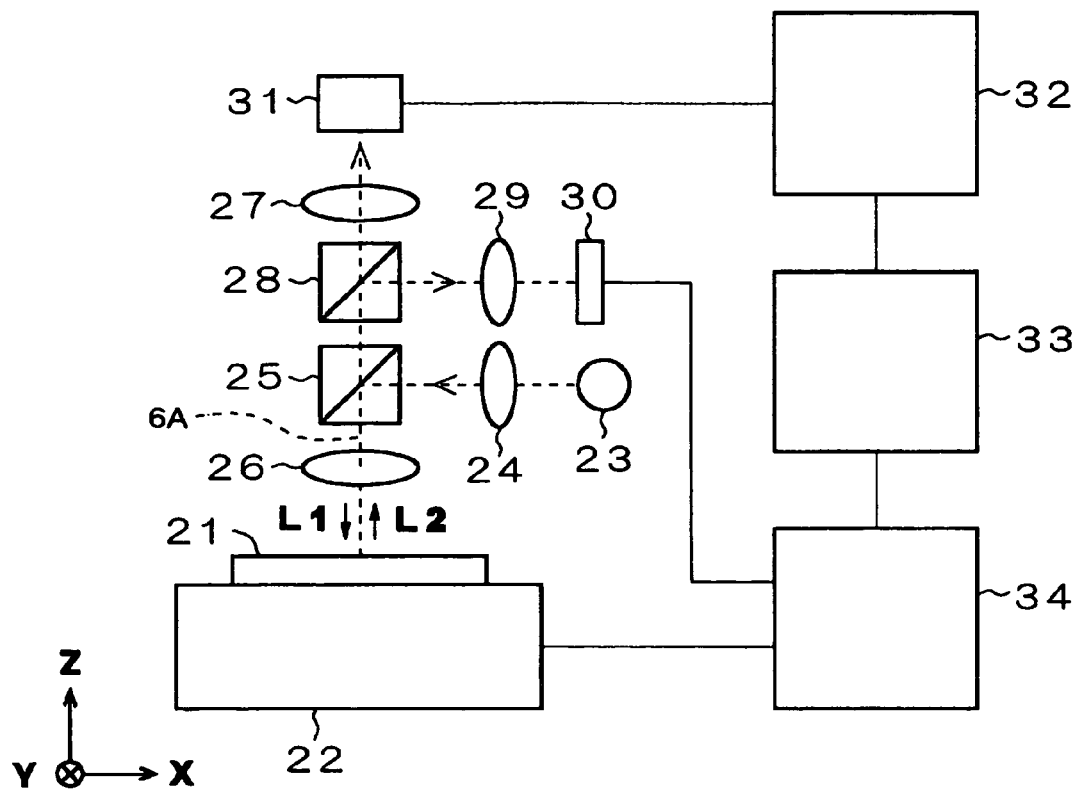
FIG. 12 shows constitution of a superposition measuring device 20.
Figure 12:
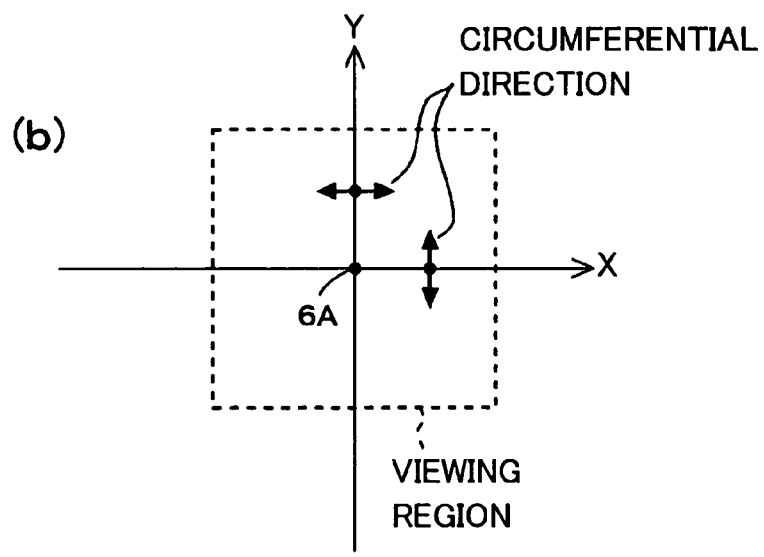

Then, the expanded optical image of the positional deviation detecting mark 10 in FIG. 11 positioned as above is formed on the image pickup surface of the image pickup device 31 through the imaging system (25 to 28). Generally, the closer to the center of the viewing region (the optical axis 6A of the objective lens 26), the smaller the influence of distortion of the imaging system (25 to 28), and the further to the periphery, the larger the influence thereof, and the distortion occurs in rotation symmetry in radius directions. Further, as the result of long years of study, the inventors of the present invention have found the fact that distortion hardly occurs in circumferential direction. In the orthogonal coordinate system having the origin on the optical axis 6A (see FIG. 12(b)), the circumferential direction corresponds, on the X axis, to a direction parallel to the Y axis, and corresponds, on the Y axis, to a direction parallel to the X axis.

Further, the phrase, "distortion hardly occurs in circumferential direction" means that there is no distortion in the Y axis direction on the X axis of the orthogonal coordinate system having the origin on the optical axis 6A, and that there is a little distortion in the Y direction near the X axis even when departing from the X axis. Consequently, it can be said that there appears little influence of distortion in the Y direction on expanded optical images of the linear pattern 11 of the underlying mark 10A and the linear pattern 13 of the resist mark 10B positioned near the X axis (both are parallel to the X axis). Expanded optical images of these linear patterns 11, 13 are used for positional deviation detection of the underlying mark 10A and the resist mark 10B in the Y axis direction.

In the same way, there is no distortion in the X axis direction on the Y axis of the orthogonal coordinate system having the origin on the optical axis 6A, and there is a little distortion in the X direction near the Y axis even when departing from the Y axis. Consequently, it can be said that there appears little influence of distortion in the X direction on expanded optical images of the linear pattern 12 of the underlying mark 10A and the linear pattern 14 of the resist mark 10B positioned near the Y axis (both are parallel to the Y axis). Expanded optical images of these linear patterns 12, 14 are used for positional deviation detection of the underlying mark 10A and the resist mark 10B in the X axis direction.

In the state wherein an expanded optical image of the positional deviation detecting mark 10 (that is, expanded optical images of linear patterns 11 to 14) has been formed on the image pickup surface of the image pickup device 31, the image processing section 32 captures the expanded optical image from the image pickup device 31 as an image, and performs predetermined image processing on the image to detect positional deviation in the X axis direction and positional deviation in the Y axis direction of the underlying mark 10A and the resist mark 10B, respectively. In the image of the positional deviation detecting mark 10, luminance information corresponding to edge portions of linear patterns 11 to 14 appears independently.

Out of edge portions of linear patterns 11 to 14, for positional deviation detection in the X axis direction, edge portions of linear patterns 12, 14 being parallel to the Y axis and lying near the Y axis are used. These linear patterns 12, 14 lie near the Y axis and are hardly influenced by distortion in the X axis direction, therefore, by using edge portions of linear patterns 12, 14, positional deviation detection in the X axis direction can be practiced accurately.

Out of edge portions of linear patterns 11 to 14, for positional deviation detection in the Y axis direction, edge portions of linear patterns 11, 13 being parallel to the X axis and lying near the X axis are used. These linear patterns 11, 13 lie near the X axis and are hardly influenced by distortion in the Y axis direction, therefore, by using edge portions of linear patterns 11, 13, positional deviation detection in the Y axis direction can be practiced accurately.

Next, processing of positional deviation detection in the image processing section 32 will be described.

Figure 13:
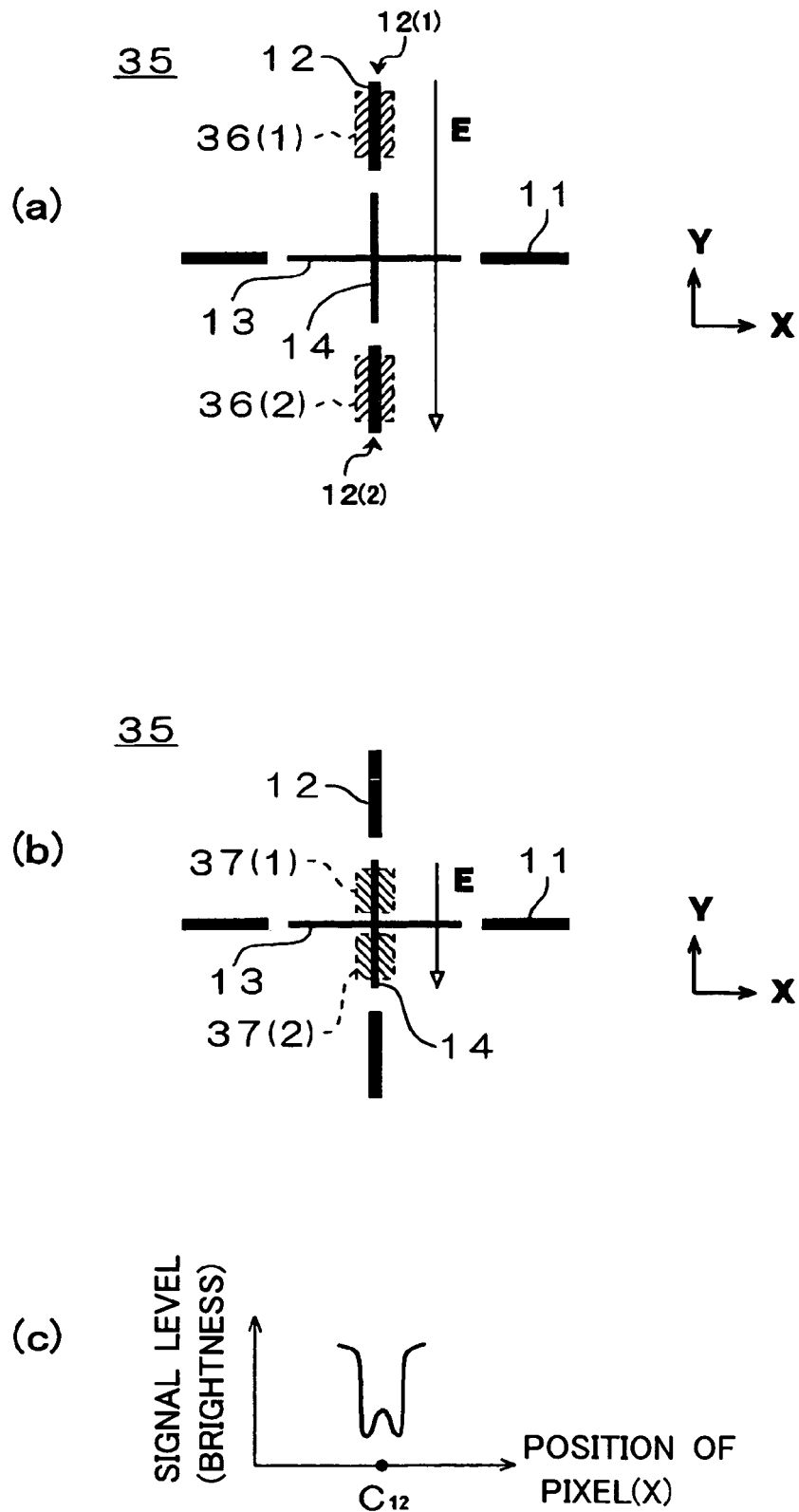
FIG. 13 illustrates partial images 36(1), 36(2), 37(1), and 37(2) for detecting the positional deviation and a waveform signal after a projection treatment.

When detecting positional deviation in the underlying mark 10A and the resist mark 10B in the X axis direction, the image processing section 32 clips two partial images 36(1), 36(2) concerning the linear pattern 12 parallel to the Y axis (a part of the underlying mark 10A shown in FIG. 11(*b*)) from an image 35 of the positional deviation detecting mark 10 (FIGS. 13(*a*), 13(*b*)), and clips two partial images 37(1), 37(2) concerning the linear pattern 14 parallel to the Y axis (a part of the resist mark 10B shown in FIG. 11(*c*)).

Partial images 36(1), 36(2) in FIG. 13(*a*) are individually clipped for respective partial patterns 12(1), 12(2) of the linear pattern 12. Partial images 37(1), 37(2) in FIG. 13(*b*) are clipped of the linear pattern 14 so as not to include a point intersecting with the linear pattern 13.

After terminating clipping of partial images 36(1), 36(2), 37(1) and 37(2) in this way, the image processing section 32 accumulates luminance values of respective pixels in the Y axis direction (E direction), in partial images 36(1), 36(2) in FIG. 13(*a*), to create a waveform signal as shown in FIG. 13(*c*) (projection processing). The horizontal axis in FIG. 13(*c*) indicates the position of a pixel, and the vertical axis indicates a signal level (brightness). Partial images 36(1), 36(2) in FIG. 13(*a*) are in a separated state having an internal void, but they are subjected to the projection processing as a continuous partial image. The accumulation direction in the projection processing (E direction in FIG. 13(*a*)) corresponds to a direction perpendicular to the direction of positional deviation detection (here, the X axis direction). The similar projection processing is performed for partial images 37(1), 37(2) in FIG. 13(*b*).

Then, using the waveform signal created from partial images 36(1), 36(2) in FIG. 13(*a*) (see FIG. 13(*c*)), auto-correlation of the waveform signal is calculated by, for example, a well known correlation method (such as a folding correlation method) to calculate the center position C12 of the linear pattern 12 in the X axis direction (which corresponds to the position of the linear direction S12 shown in FIG. 11(*b*) in the X axis direction). In the same way, auto-correlation of the waveform signal occurring from partial images 37(1), 37(2) in FIG. 13(*b*) is calculated to calculate the center position C14 of the linear pattern 14 in the X axis direction (which corresponds to the position of the linear direction S14 shown in FIG. 11(*c*) in the X axis direction).

Then, the difference of center positions C12, C14 is calculated as a positional deviation amount between the linear direction S12 of the linear pattern 12 and the linear direction S14 of the linear pattern 14 in the X axis direction, that is, a positional deviation amount between the underlying mark 10A and the resist mark 10B in the X axis direction. Herewith, processing of the positional deviation detection in the X axis direction terminates.

Positional deviation n the Y axis direction is also detected through a procedure similar to the above-described one for the positional deviation detection in the X axis direction. In this case, the image processing section 32 clips partial images individually for respective partial patterns 11(1), 11(2) of the linear pattern 11 parallel to the X axis (a part of the underlying mark 10A) from the image of the positional deviation detecting mark 10 (see partial images 36(1), 36(2) in FIG. 13(*a*)), and clips a partial image so as not to include a point intersecting with the linear pattern 14 in the linear pattern 13 parallel to the X axis (a part of the resist mark 10B) (see partial images 37(1), 37(2) in FIG. 13(*b*)).

Then, a projection processing is performed on two partial images of the linear pattern 11 for accumulating luminance values of respective pixels in the X axis direction. By auto-correlation calculation of the obtained waveform signal, the center position C11 of the linear pattern 11 in the Y axis direction (which corresponds to the position of the linear direction S11 shown in FIG. 11(*b*) in the Y axis direction) is calculated. In this case also, two partial images are separate with an internal void, but they are subjected to the projection processing as a continuous partial image. In addition, the similar projection processing is performed for two partial images relative to the linear pattern 13, and, from auto-correlation calculation of the obtained waveform signal, the center position C13 of the linear pattern 13 in the Y axis direction (which corresponds to the position of the linear direction S13 shown in FIG. 11(*c*) in the Y axis direction) is calculated.

Then, the difference of center positions C11, C13 is calculated as a positional deviation amount between the linear direction S11 of the linear pattern 11 and the linear direction S13 of the linear pattern 13 in the Y axis direction, that is, the positional deviation amount between the underlying mark 10A and the resist mark 10B in the Y axis direction. Herewith, processing of the positional deviation detection in the Y axis direction also terminates.

As described above, since the positional deviation detecting mark 10 of the second embodiment includes the underlying mark 10A in a cross-shape composed of linear patterns 11, 12 in FIG. 11(*b*) and the resist mark 10B in a cross-shape composed of linear patterns 13, 14 in FIG. 11(*c*), the following effect is exerted by approximately matching centers thereof (that is, the center CA of the underlying mark 10A and the center CB of the resist mark 10B) with the center of the viewing region (optical axis 6A) upon positional deviation detection.

That is, since linear patterns 12, 14 for positional deviation detection in the X axis direction (each is parallel to the Y axis) lie near the Y axis of an orthogonal coordinate system having the origin on the optical axis 6A, it is possible to reduce the influence of distortion of the imaging system (25 to 28) in the X axis direction. Further, since linear patterns 11, 13 for positional deviation detection in the Y axis direction (each is parallel to the X axis) lie near the X axis of an orthogonal coordinate system having the origin on the optical axis 6A, it is possible to reduce the influence of distortion of the imaging system (25 to 28) in the Y axis direction.

Consequently, by using edge portions of linear patterns 12, 14 lying near the Y axis in the image of the positional deviation detecting mark 10 captured upon the positional deviation detection, it is possible to accurately calculate the positional deviation amount of linear directions S11, S13 of linear patterns 12, 14 in the X axis direction (that is, the positional deviation amount between the underlying mark 10A and the resist mark 10B in the X axis direction). Further, by using edge portions of linear patterns 11, 13 lying near the X axis, it is possible to accurately calculate the positional deviation amount of linear directions S11, S13 of linear patterns 11, 13 in the Y axis direction (that is, the positional deviation amount between the underlying mark 10A and the resist mark 10B in the Y axis direction).

Further, since edge portions of linear patterns 12, 14 in the image of the positional deviation detecting mark 10 extend along the Y axis near the Y axis, it is possible to assure a lot of significant image information upon positional deviation detection in the X axis direction to improve the S/N ratio of the waveform signal for positional deviation detection. Therefore, positional deviation in the X axis direction can be detected with good reproducibility. In the similar way, since edge portions of linear patterns 11, 13 extend along the X axis near the X axis, it is possible to assure a lot of significant image information upon positional deviation detection in the Y axis direction to improve the S/N ratio of the waveform signal for positional deviation detection. Therefore, positional deviation in the Y axis direction can be detected with good reproducibility.

According to the second embodiment, since it is possible to detect positional deviation of the underlying mark 10A and the resist mark 10B in the X axis direction and in the Y axis direction accurately with good reproducibility to make highly accurate superposition inspection of the resist pattern relative to the underlying pattern of the substrate 21 possible. Specifically, superposition inspection is made possible with an accuracy of around 3 nm. Therefore, it is possible to cope with an oncoming process rule in the production process of semiconductor device or the like (minimum line width of a circuit pattern: 100 nm or less, superposition accuracy: about 30 nm or less).

Further, since it is possible to extract a lot of significant image information for positional deviation detection in the X axis direction and in the Y axis direction from one image of the positional deviation detecting mark 10, there is no necessity to increase the number of capturing an image from the image pickup device 31, which improves the throughput of positional deviation detection.

When a partial image for positional deviation detection concerning linear patterns 11, 12 (see partial images 36(1), 36(2) in FIG. 13(a)) is clipped of an image of the positional deviation detecting mark 10, in the case of the linear pattern 11, a partial image is individually clipped for respective partial patterns 11(1), 11(2), and, in the case of the linear pattern 12, a partial image is individually clipped for respective partial patterns 12(1), 12(2), therefore positional deviation can be satisfactorily detected without the influence of edge portions of other linear patterns.

Further, when a partial image for positional deviation detection concerning linear patterns 13, 14 (see partial images 37(1), 37(2) in FIG. 13(b)) is clipped of an image of the positional deviation detecting mark 10, in the case of the linear pattern 13, a partial image is clipped so as not to include a part intersecting with the linear pattern 14, and, in the case of the linear pattern 14, a partial image is clipped so as not to include a part intersecting with the linear pattern 13, therefore positional deviation can be satisfactorily detected without the influence of edge portions of other linear patterns.

According to the second embodiment, even when the center of the positional deviation detecting mark 10 (that is, the center CA of the underlying mark 10A or the center CB of the resist mark 10B) is not exactly matched with the center of the viewing region (optical axis 6A), linear patterns 11 to 14 can be positioned near the X axis and Y axis of an orthogonal coordinate system having the origin on the optical axis 6A, thus the influence of distortion of the imaging system (25 to 28) can be reduced. Consequently, it is not necessary to use a very costly product (for example, one having positioning accuracy of about 1 μm or less) as the stage 22 and the system can be constructed comparatively inexpensively.

Furthermore, since auto-correlation is calculated using the whole waveform signal after projection processing while using a well known correlation method (such as a folding correlation method), the second embodiment is hardly influenced by signal noise, and can calculate the positional deviation amount between the underlying mark 10A and the resist mark 108 with good reproducibility. Incidentally, the positional deviation amount may be calculated based on the bottom position of a waveform signal, instead of a correlation method.

Third Embodiment

Hereinafter, a third embodiment of the invention will be described in detail using FIG. 14.

Figure 14:
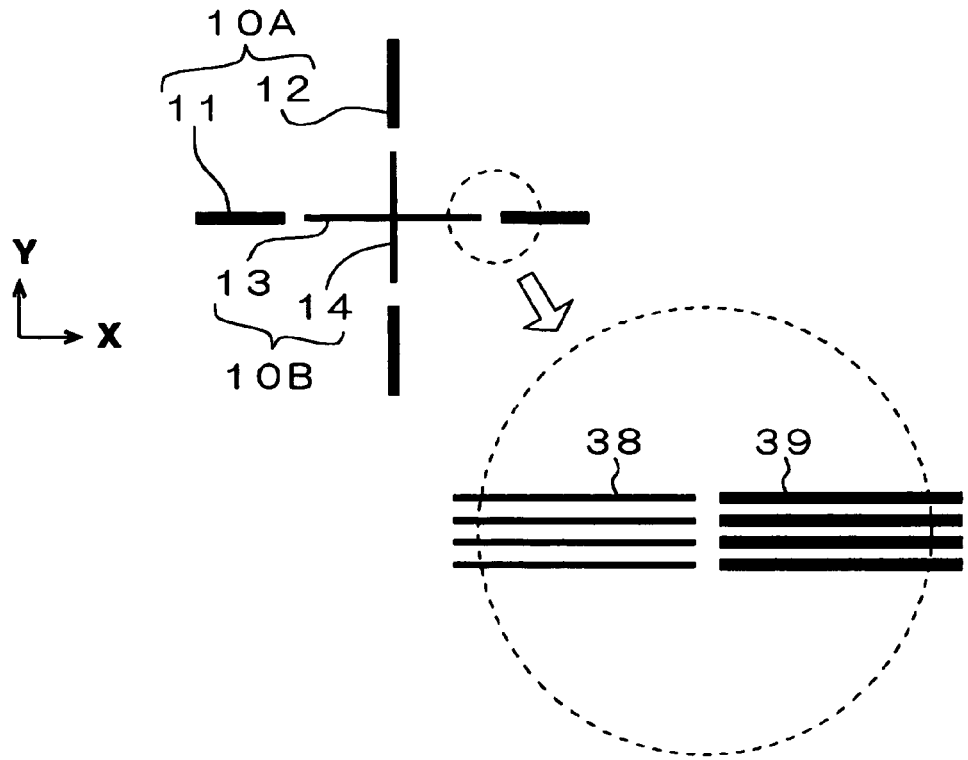
FIG. 14 illustrates constitution of the positional deviation detecting mark of a third embodiment.

As shown in FIG. 14, in a positional deviation detecting mark of a third embodiment, linear patterns 11, 13 are constituted of an aggregation of plural fine linear patterns 38, 39 separated in the width direction (sub mark group), and linear patterns 12, 14 are constituted of a similar sub mark group. At least one linear pattern instead of all the linear patterns 11 to 14 may be constituted of the sub mark group.

Constituting at least one of linear patterns 11 to 14 with a sub mark group as in the positional deviation detecting mark of the third embodiment enables CMP polishing with good uniformity. It is also advantageous that the mark hardly degrades by CMP polishing.

When the width of fine linear patterns 38, 39 of a sub mark group is set within the resolving power of the objective lens 26, there are many edges relating to the width direction of linear patterns 13, 11 being an aggregation of linear patterns 38, 39 (direction of positional deviation detection), thus reproducibility of the positional deviation detection is improved by an averaging effect. Further, by setting the width of fine linear patterns 38, 39 to a width comparable with the line width of a circuit pattern, accuracy of the positional deviation detection is improved.

Fourth Embodiment

Hereinafter, a fourth embodiment of the invention will be described in detail using FIG. 15.

Figure 15:
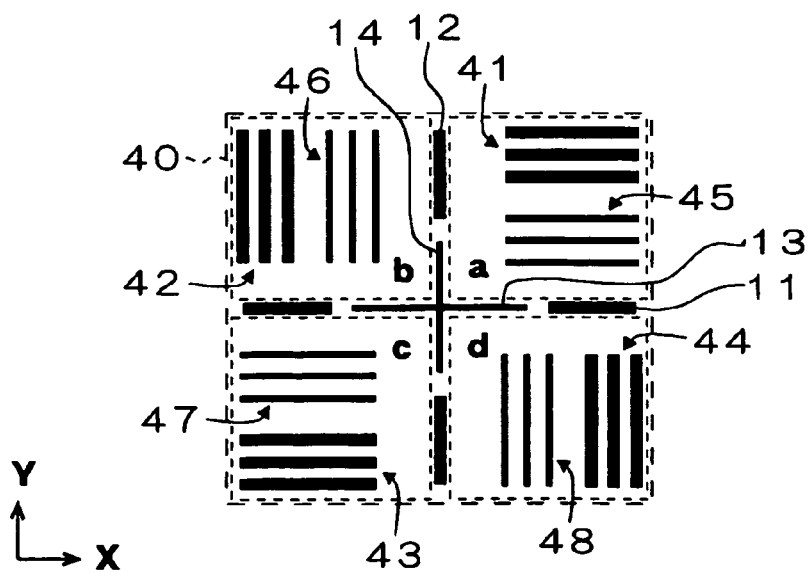
FIG. 15 illustrates constitution of the positional deviation detecting mark of a fourth embodiment.

As shown in FIG. 15, the positional deviation detecting mark of the fourth embodiment is a mark in which underlying marks (41 to 44) indicating other reference positions of the underlying pattern and resist marks (45 to 48) indicating other reference positions of the resist pattern are arranged so as not to overlap with one another in four regions a to d comparted by the underlying mark 10A and the resist mark 10B (that is, linear patterns 11 to 14) inside a rectangular area 40 circumscribing the linear pattern 11 and the linear pattern 12. The novel underlying marks (41 to 44) and the resist marks (45 to 48) are composed of a pattern of line-and-space (grating structure).

In the positional deviation detecting mark of the fourth embodiment constituted as described above, since other underlying marks (41 to 44) and resist marks (45 to 48) are effectively arranged by separating them to four areas a to d inside the rectangular area 40, two types of marks can be included without enlarging an occupying area.

Further, according to the positional deviation detecting mark of the fourth embodiment, positional deviation of the underlying mark 10A and the resist mark 10B, and positional deviation of the underlying marks (41 to 44) and the resist marks (45 to 48) can be detected in a state that the center CA of the underlying mark 10A composed of linear patterns 11, 12 (FIG. 11(b)) and the center CB of the resist mark 10B composed of linear patterns 13, 14 (FIG. 11(c)) approximately match with the center of the viewing region (optical axis 6A).

Actual positional deviation may be performed with both of a crucial mark (linear patterns 11 to 14) and a line-and-space mark (41 to 48), or optimum one may be selected from two types at inspection. The crucial mark is advantageous that, since vicinity of the optical axis is utilized, positional deviation can be highly accurately detected with almost no influence of the distortion of the imaging system (25 to 28). The line-and-space mark is advantageous in obtaining an average detection result. By selecting the optimal one out of the two types, accuracy of the positional deviation detection is improved.

In the fourth embodiment, other underlying marks (41 to 44) and resist marks (44 to 48) are arranged in four areas a to d resulting from dividing the inside of the rectangular area 40. However, the invention is not limited thereto. Another mark showing the reference position (at least one of the underlying mark and the resist mark) may be arranged in at least one of areas a to d.

Fifth Embodiment

Hereinafter, a fifth embodiment of the invention will be described in detail using FIG. 16.

Figure 16:
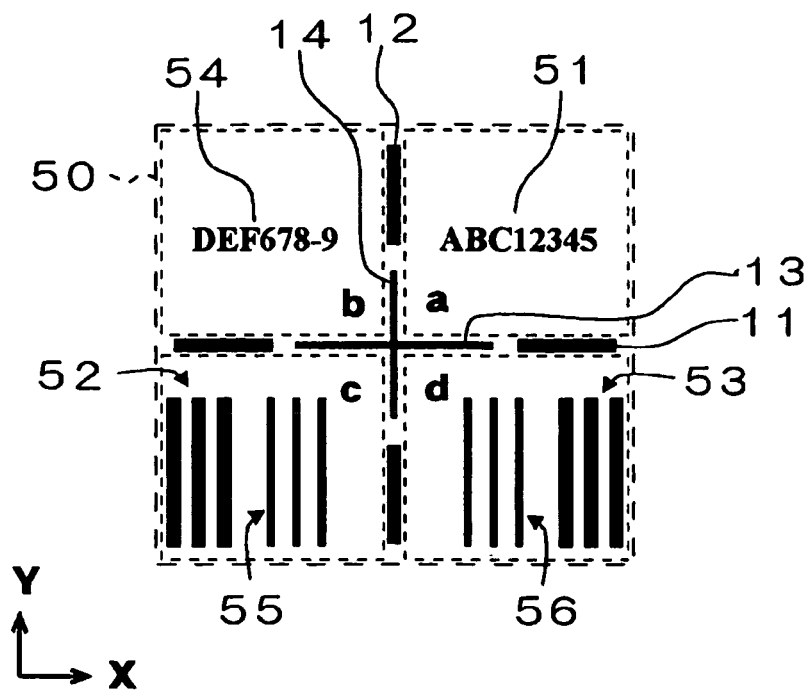
FIG. 16 illustrates constitution of the positional deviation detecting mark of a fifth embodiment.

As shown in FIG. 16, the positional deviation detecting mark according to a fifth embodiment is a mark in which a process information 51 concerning formation of the underlying pattern, dummy patterns 52, 53 formed at the same time as the underlying pattern, a process information 54 concerning formation of the resist pattern, and dummy patterns 55, 56 formed at the same time as the resist pattern are arranged in four areas a to d comparted by dividing the inside of a rectangular area 50 circumscribing the linear pattern 11 and the linear pattern 12 by the underlying mark 10A and the resist mark 10B (that is, linear patterns 11 to 14). Process informations 51, 54 are reticle numbers or the like.

Use of the positional deviation detecting mark of the fifth embodiment constituted as described above allows positional deviation of the underlying mark 10A and the resist mark 10B to be detected in a state that the center CA of the underlying mark 10A composed of linear patterns 11, 12 (FIG. 11(b)) and the center CB of the resist mark 10B composed of linear patterns 13, 14 (FIG. 11(c)) approximately match with the center of the viewing region (optical axis 6A). In addition, reading and inspecting process information 51, 54 enables an error or the like in an exposed reticle to be recognized. Also, provision of the dummy patterns 52, 53, 55 and 56 allows CMP polishing in a uniform condition similar to that for other portions.

In the fifth embodiment, out of four areas a to d inside the rectangular area 50, respective process information 51, 54 concerning formation of the underlying pattern and the resist pattern are arranged in areas a, b. But the invention is not limited thereto. The process information concerning the formation of one of the underlying pattern and the resist pattern may be arranged in at least one of four areas a to d.

Sixth Embodiment

Hereinafter, a sixth embodiment of the invention will be described in detail using FIG. 17.

Figure 17:
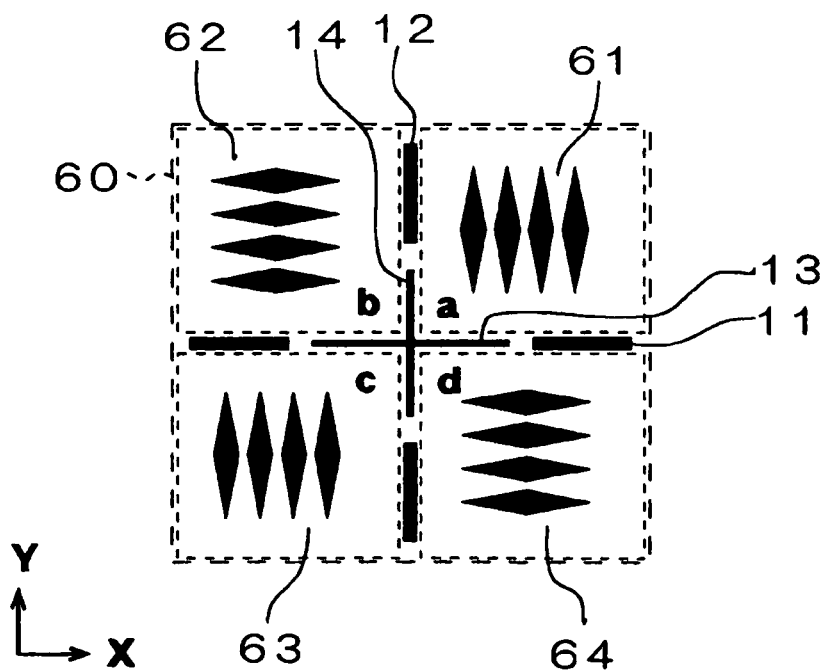
FIG. 17 illustrates constitution of the positional deviation detecting mark of a sixth embodiment.

As shown in FIG. 17, the positional deviation detecting mark of a sixth embodiment is constituted by arranging exposure condition inspecting marks 61 to 64 concerning formation of at least one of the underlying pattern and the resist pattern in four areas a to d comparted by dividing the inside of a rectangular area 60 circumscribing the linear pattern 11 and the linear pattern 12 by the underlying mark 10A and the resist mark 10B (that is, linear patterns 11 to 14). Marks 61 to 64 are cuneate SMP (Self Measurement Program) marks, the length of which varies in accordance with exposure conditions (a dose amount and focus misalignment amount).

Use of the positional deviation detecting mark of the sixth embodiment constituted as described above allows positional deviation of the underlying mark 10A and the resist mark 10B to be detected in a state that the center CA of the underlying mark 10A composed of linear patterns 11, 12 (FIG. 11(b)) and the center CB of the resist mark 10B composed of linear patterns 13, 14 (FIG. 11(c)) approximately match with the center of the viewing region (optical axis 6A). In addition, it allows exposure conditions (dose amount and focus misalignment amount) to be inspected in accordance with variations of the length of marks 61 to 64.

In the sixth embodiment, marks 61 to 64 are arranged in four areas a to d inside the rectangular area 60, but the invention is not limited thereto. A similar SMP mark may be arranged in at least one of four areas a to d.

Seventh Embodiment

Hereinafter, a seventh embodiment of the invention will be described in detail using FIG. 18.

Figure 18:
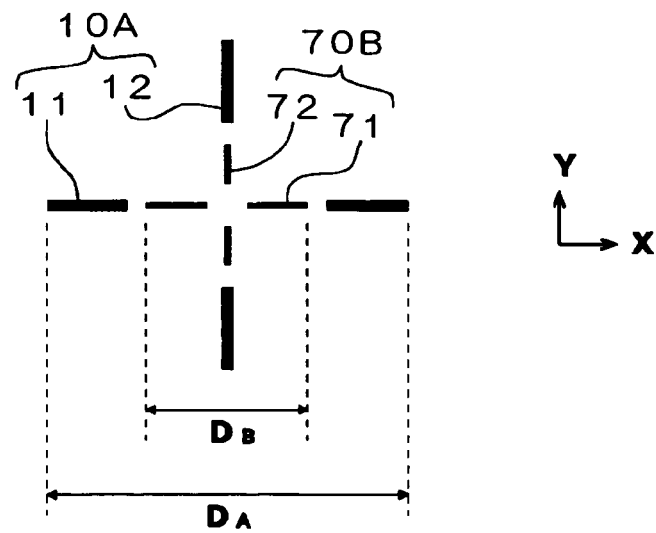
FIG. 18 illustrates constitution of the positional deviation detecting mark of a seventh embodiment.
Figure 18:
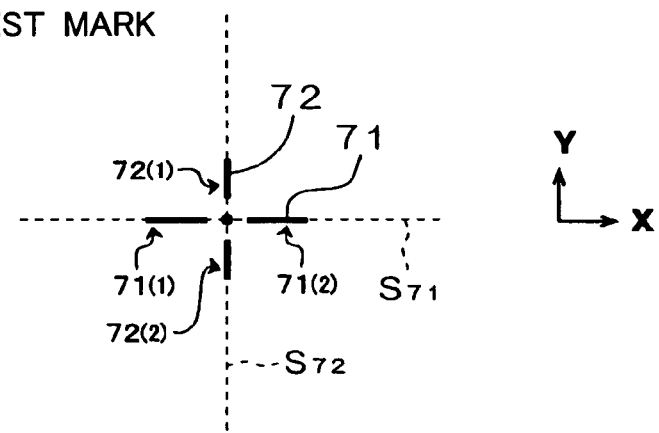
Figure 18:
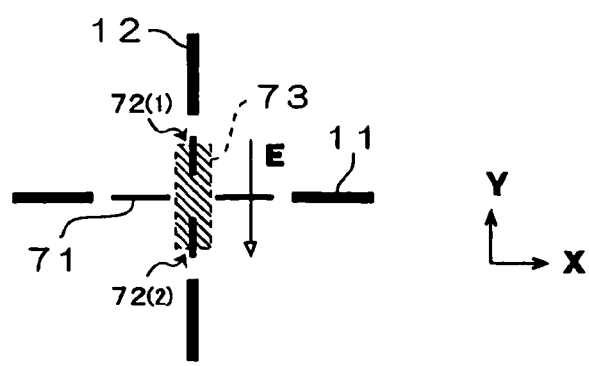
Figure 19:
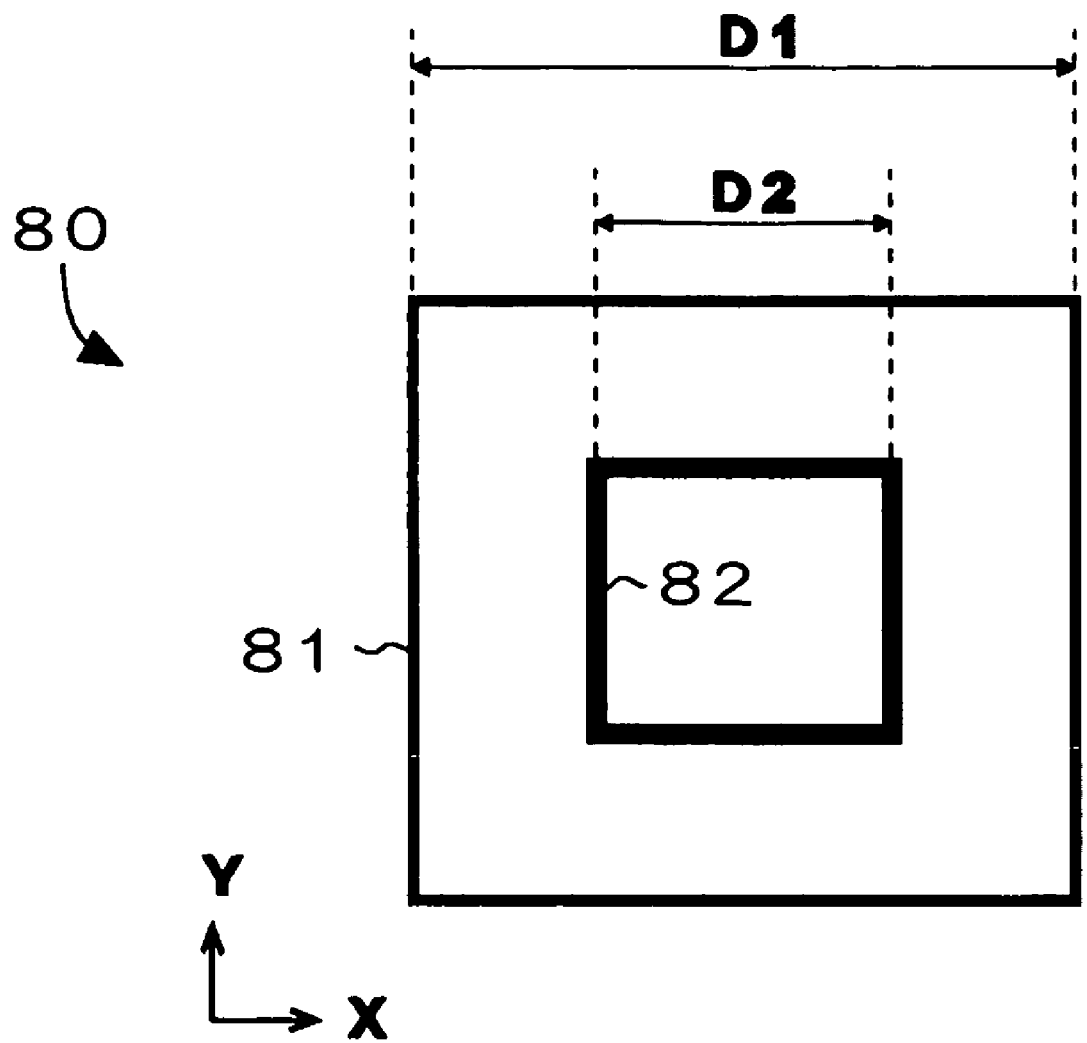
FIG. 19 shows constitution of a duplex mark 80 of the third related art.

As shown in FIG. 18, in a positional deviation detecting mark 70 of a seventh embodiment, a resist mark 70B is provided in place of the resist mark 10B of the positional deviation detecting mark 10 in FIG. 11. The resist mark 70B is a mark in which a linear pattern 71 that is parallel to the linear pattern 11 and a linear pattern 72 that is parallel to the linear pattern 12 are cruciately arranged. Linear patterns 71, 72 are composed of two partial patterns 71(1), 71(2), 72(1) and 72(2) having shorter lengths between both ends than linear patterns 11, 12 and being divided into one side and the other side of linear directions S71, S72, respectively, so as not to cross with each other.

Use of the above-described positional deviation detecting mark 70 makes it possible to easily clip a partial image of linear patterns 71, 72 of the resist mark 70B from an image of the positional deviation detecting mark 70 shown in FIG. 18(c) upon positional deviation detection. For example, in the case of the linear pattern 71, one partial image 73 continuing from a partial pattern 72(1) to a partial pattern 72(2) may be clipped. The case for the linear pattern 72 is similar, and one partial image continuing from the partial pattern 71(1) to the partial pattern 71(2) may be clipped.

Since linear patterns 71, 72 do not cross with each other, even when continuous one partial image is clipped, positional deviation detection can be satisfactorily practiced without influence of edge portions of other linear patterns.

Modified Examples of Second to Seventh Embodiments

In the above-described embodiments, description is made while taking superposition inspection (positional deviation detection) of the resist pattern relative to the underlying pattern formed on a different layer of the substrate 21 as the example, but the invention is not limited thereto. The invention is also applicable to a case where positional deviation of two patterns formed on the same layer of the substrate 21 is detected.

Further, description has been made on the example of positional deviation detection processing by the image processing section 32 of the superposition measuring device 20, but the invention is not limited thereto. The same effect can be obtained when an outside computer connected to the superposition measuring device is used.

Eighth Embodiment

Hereinafter, an eighth embodiment of the invention will be described in detail using FIGS. 20 to 24.

Figure 20:
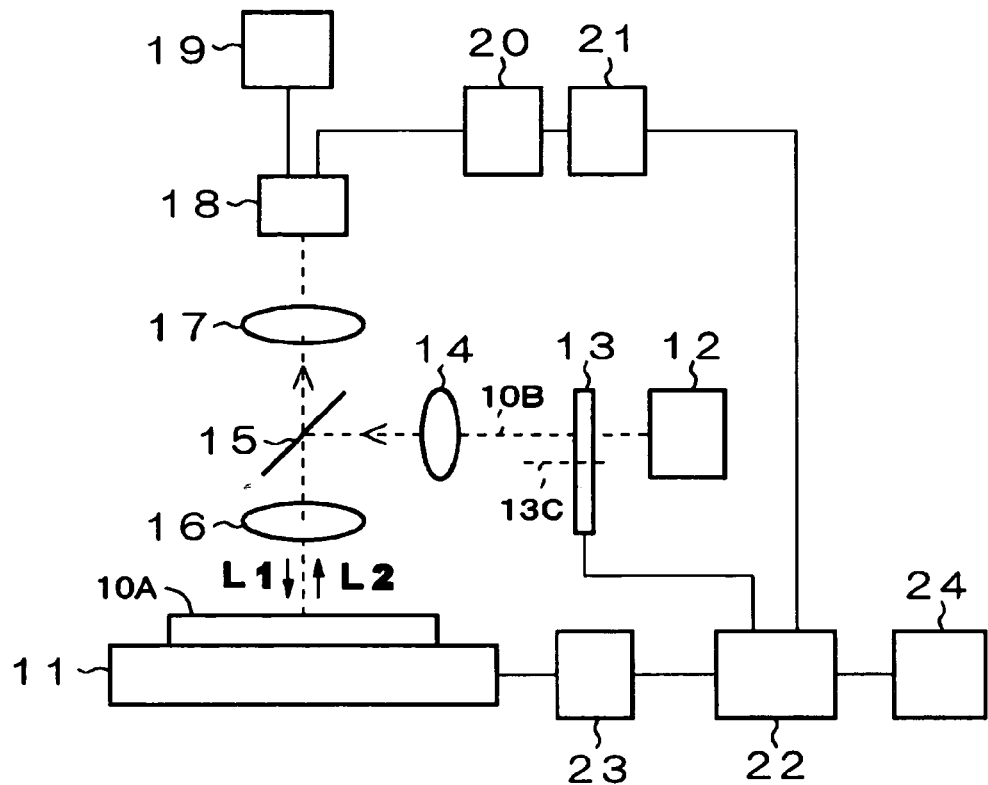
FIG. 20 shows constitution of a superposition inspecting device 10 of an eighth embodiment.
Figure 20:
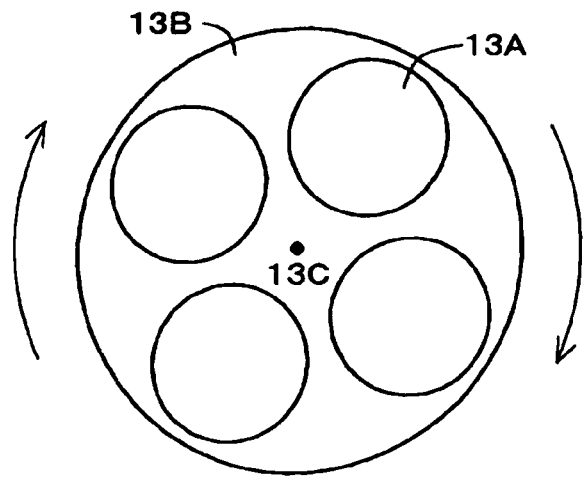

Here, description will be made about a position detecting method and device of the embodiment while taking a superposition inspecting device 10 shown in FIG. 20 as an example. The superposition inspecting device 10 is a device for performing superposition inspection of resist patterns (not shown) of the substrate 10A in a production process of a semiconductor device, a liquid crystal display device and the like. In the superposition inspection, a positional deviation amount of the resist pattern relative to a circuit pattern formed on the underlying layer of the substrate 10A (hereinafter, referred to as an underlying pattern) is measured.

As shown in FIG. 20(a), the superposition inspecting device 10 of the embodiment is constituted of a stage 11 for supporting a substrate 10A, an illumination system (12 to 16) for irradiating the substrate 10A with illumination light L1, an imaging system (16, 17) for forming an optical image of the substrate 10A, an image pickup device 18, a TV monitor 19 for observation, signal processing sections (20, 21), and controlling sections (22 to 24).

First, the substrate 10A will be described. The substrate 10A is a semiconductor wafer, a liquid crystal substrate or the like, and in a state after exposure/development for the resist layer and before processing for a predetermined material film. An unprocessed material film is formed between the resist layer and the underlying layer.

Figure 21:
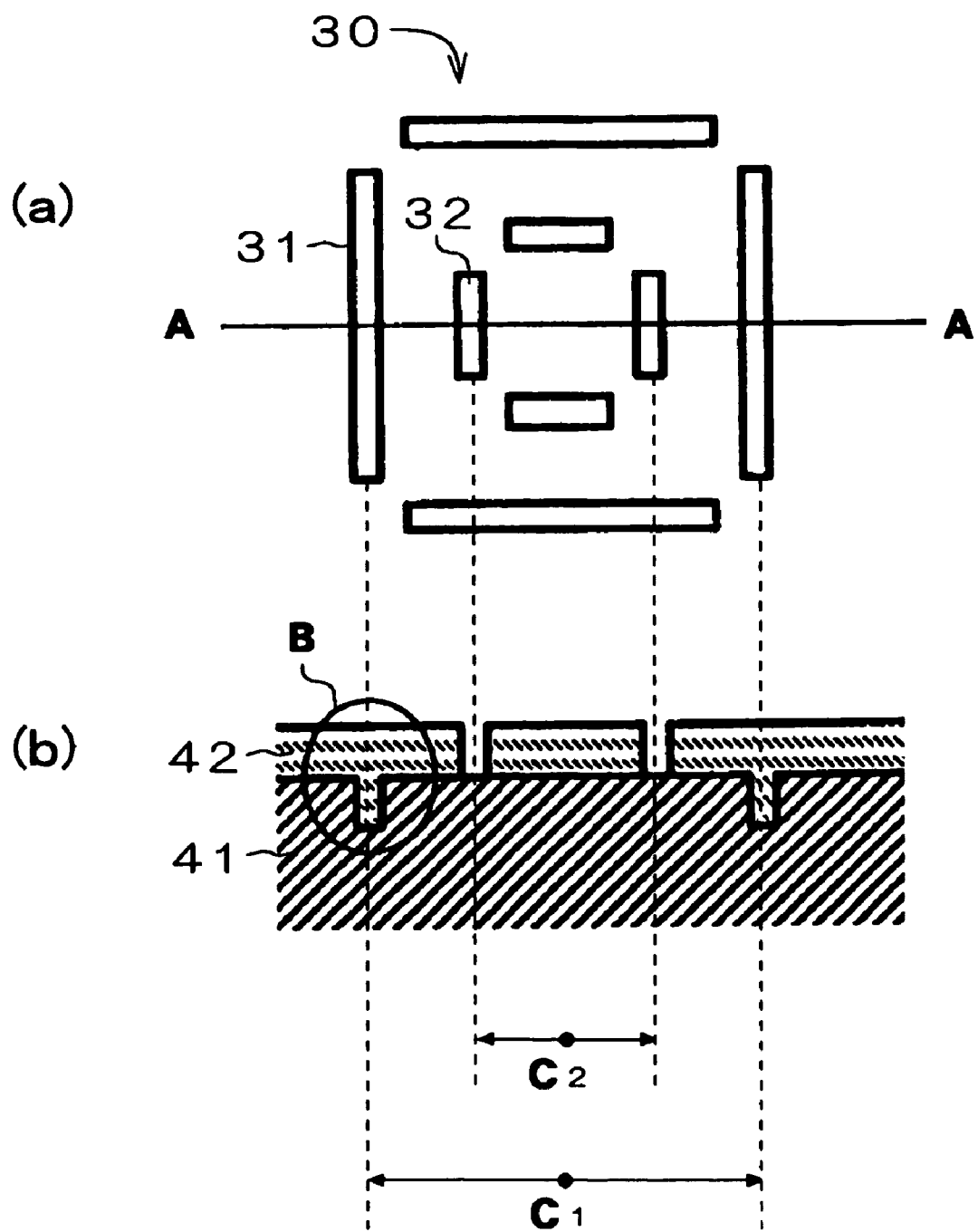
FIG. 21 illustrates an underlying mark 31 and a resist mark 32.
Figure 22:
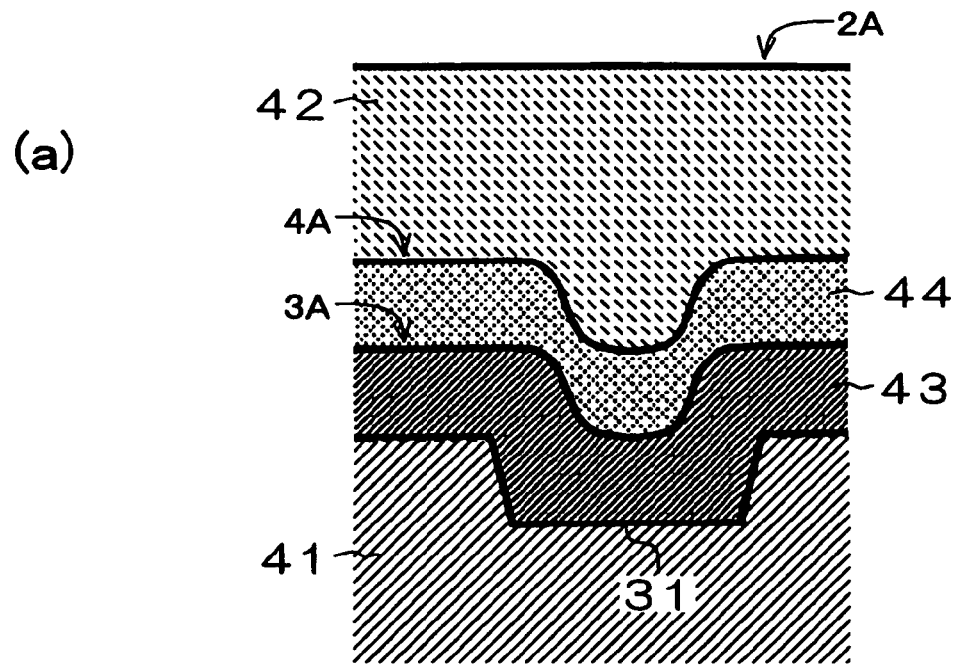
FIG. 22 illustrates intermediate layers 43, 44.
Figure 22:
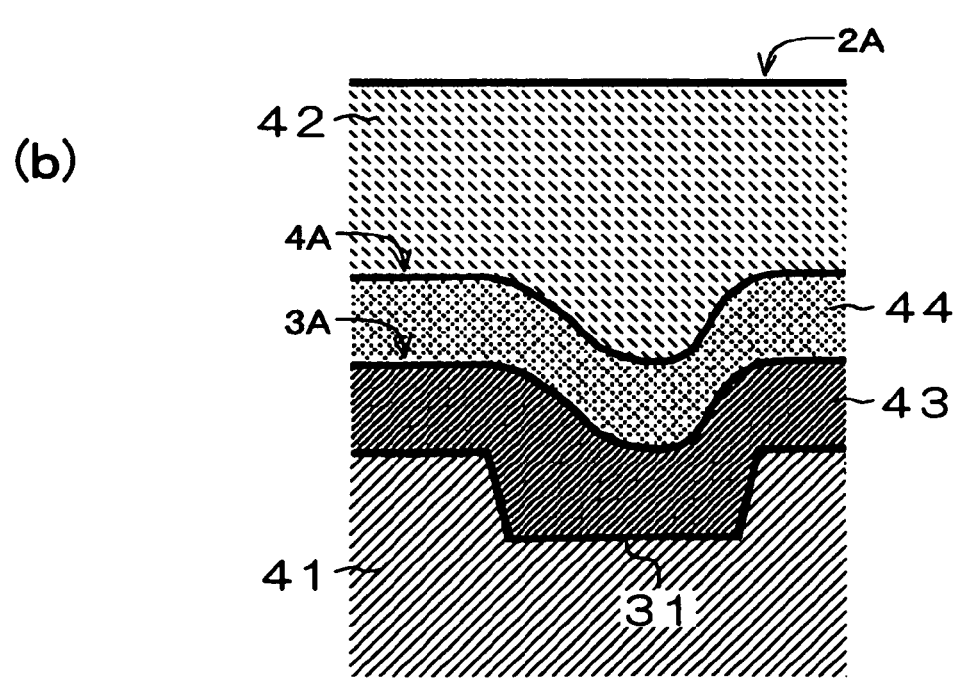
Figure 23:
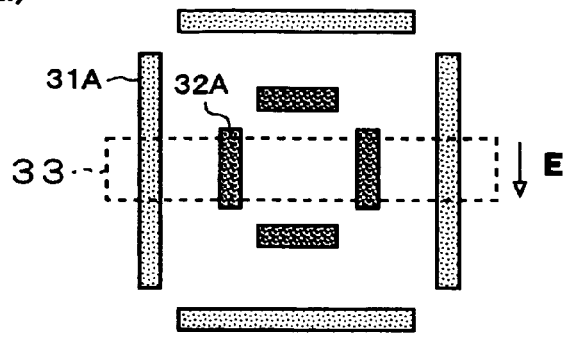
FIG. 23 illustrates an image and a waveform signal of a mark.
Figure 23:
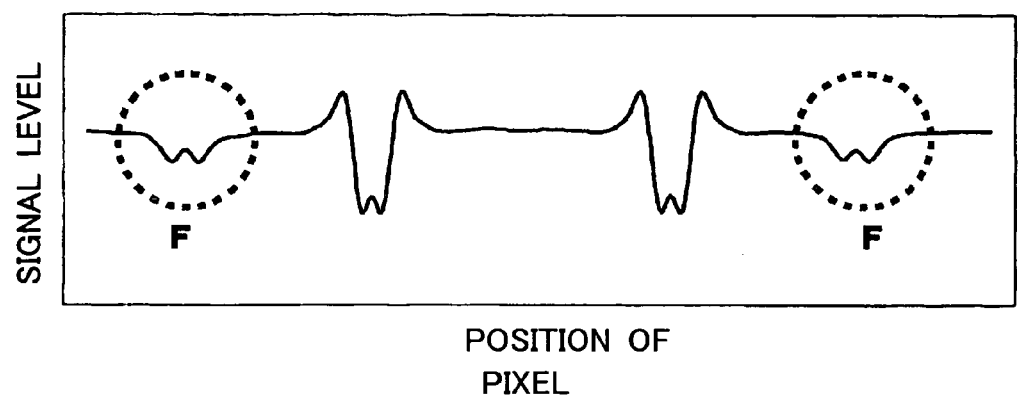
Figure 23:
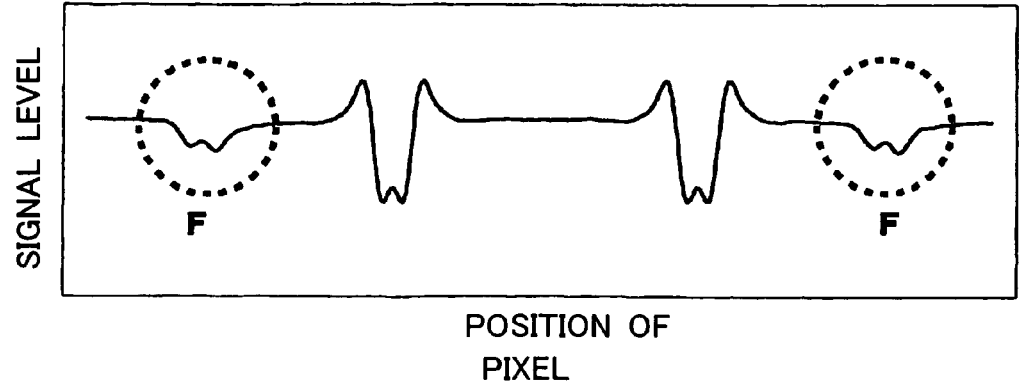

For superposition inspection of the resist pattern of the substrate 10A, such a duplex mark 30, for example, as shown in FIG. 21 is used. The duplex mark 30 is formed at many pre-designated positions on the surface of the substrate 10A (surface to be inspected). FIGS. 21(a), 21(b) are a plan view and an A-A cross-sectional view. In FIG. 21(b), showing of the unprocessed material film is omitted.

The duplex mark 30 is composed of two superposition marks 31, 32 having different sizes. The outside superposition mark 31 is composed of four concave portions formed on an underlying layer 41 and indicates the reference position of the underlying pattern. The inside superposition mark 32 is composed of four concave portions formed on a resist layer 42, and indicates the reference position of the resist pattern. Each of concave portions of superposition marks 31, 32 is in a bar-like shape, and the duplex mark 30 constitutes a bar in bar mark. Hereinafter, the superposition mark 31 of the underlying layer 41 is referred to as an underlying mark 31. The superposition mark 32 of the resist layer 42 is referred to as a resist mark 32.

As can be found from an extended drawing of a B portion in FIG. 21(b) (FIG. 22), between the underlying layer 41 and the resist layer 42, for example, two intermediate layers 43, 44 are formed. The intermediate layers 43, 44 are unprocessed material films, processed material films or antireflection films having transparent or translucent quality in a wavelength range of general white light. The material film is composed of a conductive material for wiring or an insulating material such as glass.

Further, two intermediate layers 43, 44 are influenced by the concave portion of the underlying mark 31, and minute concaves are created on upper surfaces 3A, 4A thereof. In an actual production process, even when the concave portion of the underlying mark 31 has a left-right symmetric figure, the figure of concaves of upper surfaces 3A, 4A of intermediate layers 43, 44 thereon occasionally do not have left-right symmetry, differing from one in FIG. 22(a), and become slightly asymmetric as in FIG. 22(b). Incidentally, an upper surface 2A of the resist layer 42 is planate irrespective of concaves of upper surfaces 3A, 4A of intermediate layers 43, 44.

The underlying mark 31 and the resist mark 32 are constituted so that respective centers C1, C2 (FIG. 21) coincide with each other when a positional deviation amount of the resist pattern relative to the underlying pattern is zero. The superposition inspecting device calculates the position of the center C1 of the underlying mark 31 and the position of the center C2 of the resist mark 32, respectively, upon superposition inspection of the resist pattern. At this time, occasionally intermediate layers 43, 44 have been formed on the underlying mark 31, and figures of concaves of upper surfaces 3A, 4A thereof become asymmetric (FIG. 22(b)). However, according to the superposition inspecting device 10 of the embodiment, it is possible to reduce such influence of intermediate layers 43, 44 to accurately detect the position of the underlying mark 31 (details will be described later).

Next, constitution of the superposition inspecting device 10 will be described.

The stage 11 is constituted of a holder for supporting a substrate 10A while maintaining the same at a horizontal level, and a driving section for moving the holder in horizontal directions (XY directions). By moving the holder of the stage 11 in XY directions, it is possible to position any one of measurement points (the duplex mark 30 shown in FIG. 21) on the surface to be inspected of the substrate 10A within the viewing region of the imaging system (16, 17).

The illumination system (12 to 16) is constituted of a light source 12, a wavelength selecting section 13, an illuminating lens 14, a half mirror 15 and an objective lens 16. The light source 12 emits white light. As shown in FIG. 20(b), the wavelength selecting section 13 is constituted of four types of color filters 13A having different spectral characteristics, and a mechanism for switching these color filters 13A (a revolver 13B and a motor not shown), and inserts any one of color filters 13A into an illumination light path 10B.

White light from the light source 12 enters, after passing through one color filter 13A of the wavelength selecting section 13, the illuminating lens 14, the half mirror 15 and the objective lens 16 (illumination light L1), the surface to be inspected of the substrate 10A on the stage 11 (epi-illumination). At this time, the measurement point (the duplex mark 30 in FIG. 21) positioned in the viewing region is approximately vertically irradiated with the illumination light L1. Then, from the duplex mark 30 irradiated with the illumination light L1, the reflected light L2 is emitted. The reflected light L2 is guided to the imaging system (16, 17) to be described later.

The spectral characteristic of the illumination light L1 is determined in accordance with the spectral characteristic of the white light emitted from the light source 12 and the spectral characteristic of the color filter 13A inserted into the illumination light path 10B. By rotating the revolver 13B of the wavelength selecting section 13 with a motor (not shown) around an axis 13C and altering the type of the color filter 13A to be inserted into the illumination light path 10B, the spectral characteristic of the illumination light L1 can be easily adjusted. The spectral characteristic of the illumination light L1 is adjusted based on an instruction from controlling sections (22 to 24) to be described later.

The imaging system (16, 17) is composed of the objective lens 16 and the imaging lens 17 (an optical microscope section). The imaging lens 17 functions as a second objective lens. The reflected light L2 from the substrate 11 enters an image pickup surface of the image pickup device 18 after passing through the objective lens 16, the half mirror 15 and the imaging lens 17. At this time, on the image pickup surface of the image pickup device 18, an expanded image based on the reflected light L2 (that is, an optical image of the duplex mark 30) is formed.

The image pickup device 18 is a black and white area sensor (for example, a CCD camera) in which plural pixels are two dimensionally disposed, which images an optical image of the duplex mark 30 on the image pickup surface and outputs an image signal to a TV monitor 19 and a signal processing section (20, 21) in the subsequent stage. The image signal output from the image pickup device 18 is composed of plural sample points and indicates distribution relating to luminance values of respective pixels on the image pickup surface. The luminance value is proportional to intensity of the reflected light L2.

As shown in FIG. 23(a), an image of the duplex mark 30 (for example, an image displayed on the TV monitor 19) has a low luminance value at positions 31A corresponding to respective concave portions of the underlying mark 31 and positions 32A corresponding to respective concave portions of the resist mark 32.

The signal processing section (20, 21) is constituted of a frame memory 20 and a CPU 21 for waveform signal calculation, and stores an image signal (FIG. 23(a)) from the image pickup device 18 in the frame memory 20. The CPU 21 defines a signal processing range 33 for the image signal (FIG. 23(a)) in the frame memory 20, and accumulates luminance values of respective pixels included in the signal processing range 33 in a longitudinal direction (E direction) to create a waveform signal shown in FIG. 23(b) or 23(c) (projection processing). The horizontal axis in FIGS. 23(b), 23(c) indicates position of a pixel and the vertical axis indicates a signal level (brightness). The F portion of the waveform signal corresponds to the underlying mark 31.

Further, the CPU 21 calculates the position of center C1 of the underlying mark 31 and the position of center C2 of the resist mark 32, respectively, by correlation operation of the waveform signal in FIGS. 23(b), 23(c) using, for example, a well known correlation method. In addition, it obtains a positional deviation amount between the underlying mark 31 and the resist mark 32 based on the result of the position detection and outputs the same to the controlling section (22 to 24) as the positional deviation amount of the resist pattern relative to the underlying pattern.

The controlling section (22 to 24) is constituted of an operation computer 22 for managing the whole device, a CPU 23 for controlling the stage and a monitor 24. The operation result by the CPU 21 (that is, the positional deviation amount) is output to the operation computer 22 and displayed on the monitor 24 via the operation computer 22. With that, a series of operations for obtaining one measurement value (that is, the positional deviation amount) terminates.

The operation computer 22 controls the stage 11 via the CPU 23 to sequentially position duplex marks 30 formed at other positions of the substrate 10A within the viewing region of the imaging system (16, 17), and captures the positional deviation amount between the underlying mark 31 and the resist mark 32 of the duplex mark 30 (that is, the positional deviation amount of the resist pattern relative to the underlying pattern) from the CPU 21 to display it on the monitor 24.

Further, prior to the above-described position detection of the underlying mark 31 and the resist mark 32 and calculation of the positional deviation amount between them, based on setting information of the illumination light L1 registered in advance, for example, in an inspection recipe, the operation computer 22 controls the wavelength selecting section 13 of the illumination system (12 to 16), and, by rotating the revolver 13B, inserts an intended color filter 13A into the illumination light path 10B. Incidentally, control of the wavelength selecting section 13 may be controlled by the operation computer 22 based on setting information of the illumination light L1 input from the outside.

As the result, it is possible to illuminate the duplex mark 30 (FIG. 21) of the substrate 11 with the illumination light L1 having an intended spectral characteristic. The intended spectral characteristic of the illumination light L1 means such spectral characteristic that can reduce influence of the intermediate layers 43, 44 (FIG. 22) formed between the underlying layer 41 and the resist layer 42 of the substrate 11 to accurately detect the position of the underlying mark 31 (which will be described next). Incidentally, the position of the resist mark 32 can be accurately detected irrespective of the spectral characteristic of the illumination light L1.

Next, influence of intermediate layers 43, 44 and intended spectral characteristic of the illumination light L upon detecting the position of the underlying mark 31 will be described.

Figure 24:
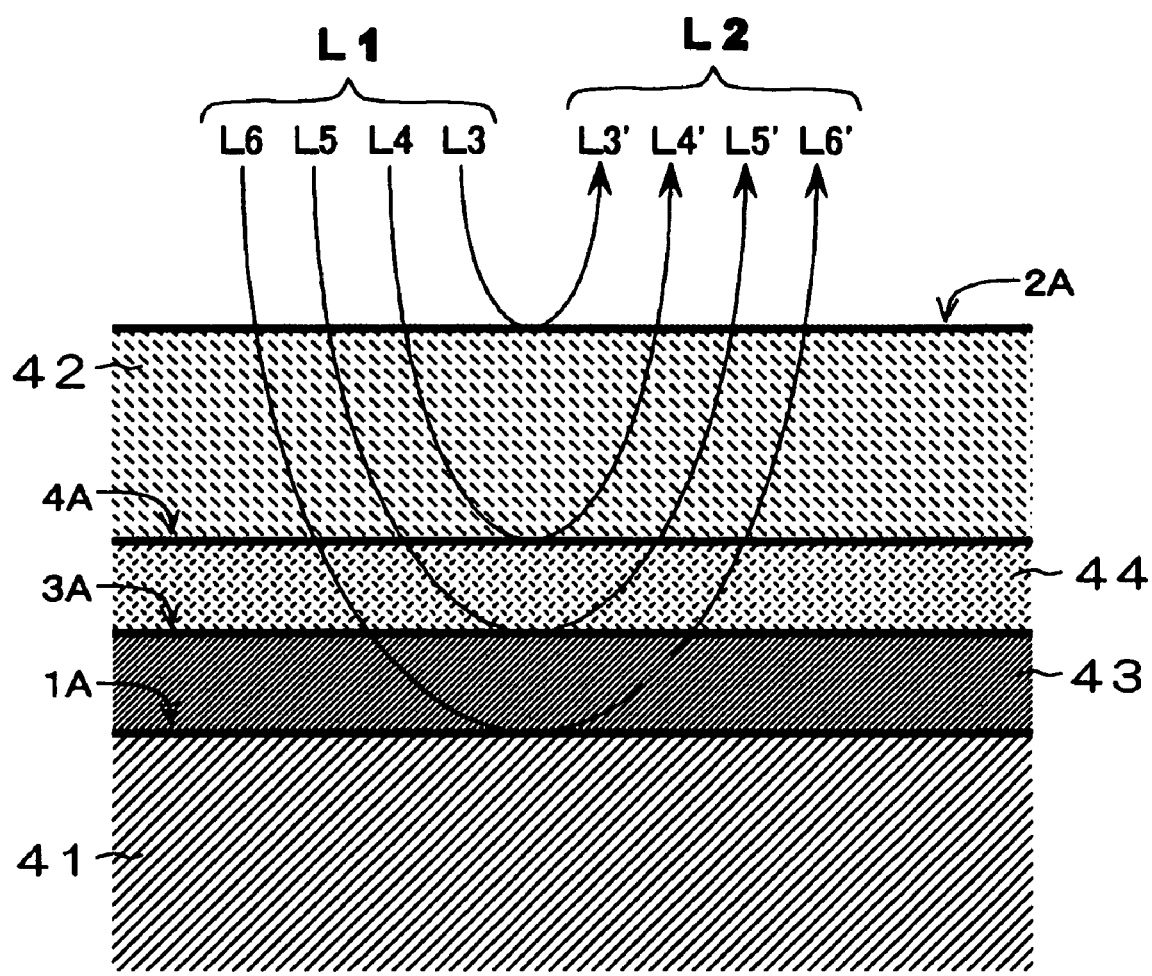
FIG. 24 illustrates lights L3' to L6' emitted from respective layers of a substrate 11.

The illumination light L1 is irradiated from the resist layer 42 side of the substrate 11, and, as shown in FIG. 24, a part of the light, L3, is reflected from an upper surface 2A of the resist layer 42, another part of the light, L4, is reflected from an upper surface 4A of the intermediate layer 44, another part of the light, L5, is reflected from an upper surface 3A of the intermediate layer 43, and a remaining part of the light, L6, is reflected from an upper surface 1A of the underlying layer 41. The upper surface 1A corresponds to the boundary surface of the underlying layer 41 and the intermediate layer 43. The upper surface 3A corresponds to the boundary surface of intermediate layers 43, 44. The upper surface 4A corresponds to the boundary surface of the intermediate layer 44 and the resist layer 42.

As described above, since the illumination light L1 is reflected from upper surfaces 1A to 4A of respective layers of the substrate 11, combination of lights L3' to L6' emitted from respective layers of the substrate 11 is to be the above-described reflected light L2 (see FIG. 20), which is guided to the image pickup device 18 through the imaging system (16, 17). Thus, an optical image based on the reflected light L2 is a combination of an optical image based on the light L3' (that is, an optical image of the upper surface 1A of the resist layer 42), an optical image based on the light L4' (that is, an optical image of the upper surface 4A of the intermediate layer 44), an optical image based on the light L5' (that is, an optical image of the upper surface 3A of the intermediate layer 43), and an optical image based on the light L6' (that is, an optical image of the upper surface 1A of the underlying layer 41).

As described above, the intermediate layers 43, 44 are influenced by concave portions of the underlying mark 31 (FIG. 22), and minute concaves are created on upper surfaces 3A, 4A thereof. And when concaves of upper surfaces 3A, 4A of intermediate layers 43, 44 have a left-right symmetric figure as in FIG. 22(a) as well as concave portions of the underlying mark 31 having a left-right symmetric figure, the waveform signal obtained from an image of the underlying mark 31 (a position 31A with low luminance in FIG. 23(a)) becomes left-right symmetric as, for example, as F portion in FIG. 23(b). Therefore, an accurate position of the underlying mark 31 can be detected.

On the other hand, even when the figure of concave portions of the underlying mark 31 is left-right symmetric, the figure of concaves of upper surfaces 3A, 4A of intermediate layers 43, 44 occasionally becomes asymmetric as in FIG. 22(b), though only slightly. In this case, when the color filter 13A of the wavelength selecting section 13 is evacuated from the illumination light path 10B and the illumination light L1 having the same spectral characteristic as white light is used for illumination, a waveform signal obtained from an image of the underlying mark 31 (the position 31A having low luminance in FIG. 23(a)) is influenced by intermediate layers 43, 44 (influenced by a concave figure of upper surfaces 3A, 4A) and becomes asymmetric as, for example, F portion in FIG. 23(c). Consequently, if nothing is done, an accurate position of the underlying mark 31 can not be detected.

Therefore, in the superposition inspecting device 10 of the embodiment, an intended color filter 13A of the wavelength selecting section 13 is inserted into the illumination light path 10B, and spectral characteristic of the illumination light L1 is adjusted to an intended spectral characteristic different from white light, thereby reducing the influence of intermediate layers 43, 44 (influence of a concave figure of upper surfaces 3A, 4A) so as to make accurate detection of the position of the underlying mark 31 possible. An intended spectral characteristic is determined in the following manner prior to position detection.

Since the intermediate layer 44 sandwiched between upper surfaces 3A, 4A is in a thin film, each of lights L5, L4 reflected from respective upper surfaces 3A, 4A of intermediate layers 43, 44 is strengthened or weakened with each other due to interference for respective components. That is, in such condition that difference in light paths corresponding to the refraction index n and the film thickness d of the intermediate layer 44 ($\approx$2nd) is M times a wavelength range $\lambda 1$ (M is an integer), respective lights L5, L4 in the wavelength range $\lambda 1$ are strengthened with each other. In such condition that difference in light paths ($\approx$2nd) is (M−½) times a wavelength range $\lambda 2$, respective lights L5, L4 in the wavelength range $\lambda 2$ are weakened with each other.

Therefore, an intended spectral characteristic of the illumination light L1 may be determined so as to increase an intensity ratio of components of the illumination light L1 in the wavelength range $\lambda 2$ relative to components thereof in the wavelength range $\lambda 1$. Lights L5, L4 are weakened with each other in the wavelength range $\lambda 1$ and they are strengthened with each other in the wavelength range $\lambda 2$. Wavelength ranges $\lambda 1$, $\lambda 2$ can be obtained from design information relating to the refraction index n and the film thickness d of the intermediate layer 44. As to the film thickness d, an actual measurement value may be used in place of design information.

In order to realize an intended spectral characteristic, it is preferred to insert the color filter 13A having such spectral characteristic as lowering intensity of components of the wavelength range $\lambda 1$ that strengthen with each other partially or wholly and, at the same time, not limiting intensity of components of the wavelength range $\lambda 2$ that weaken with each other out of the illumination light L1, into the illumination light path 10B.

Thus, by increasing the intensity ratio of components of the wavelength range $\lambda 2$ that weaken with each other relative to components of the wavelength range $\lambda 1$ that strengthen with each other, it is possible to increase the intensity ratio of light L6' from the underlying layer 41 relative to light L4' and light L5' from intermediate layers 43, 44 out of lights L3' to L6' emitted from respective layers of the substrate 11 shown in FIG. 24.

As the result, in a waveform signal obtained from an image of the underlying mark 31 (the position 31A of low luminance in FIG. 23(a)), the influence of intermediate layers 43, 44 (influence of the concave figure of upper surfaces 3A, 4A) can be reduced. Therefore, even when concave figures of upper surfaces 3A, 4A are asymmetric, the figure of the waveform signal can be approximated to such left-right symmetric figure as the F portion in FIG. 23(b), and the position of the underlying mark 31 can be accurately detected without being deluded by intermediate layers 43, 44.

Thus, in the superposition inspecting device 10 of the embodiment, since the spectral characteristic of the illumination light L1 is adjusted so as to increase the intensity ratio of the light L6' from the underlying layer 41 relative to the L4' and the light L5' from intermediate layers 43, 44, it is possible to reduce the influence of intermediate layers 43, 44 (influence of concave figure of upper surfaces 3A, 4A) and detect an accurate position of the underlying mark 31. Therefore, a positional deviation amount between the underlying mark 31 and the resist mark 32 (that is, the positional deviation amount of the resist pattern relative to the underlying pattern) can be accurately obtained to improve accuracy of the superposition inspection.

Modified Examples of Eighth Embodiment

The above-described embodiment has described the example in which the influence of intermediate layers 43, 44 is reduced using interference of lights L5, L4 reflected from upper surfaces 3A, 4A of intermediate layers 43, 44. However, the invention is not limited thereto. Instead of this, the spectral characteristic of the illumination light L1 may be adjusted so as to increase the intensity ratio of components of wavelength range that are strongly absorbed by intermediate layers 43, 44 relative to components that are weakly absorbed by intermediate layers 43, 44. Again, it is possible to increase the intensity ratio of the light L6' from the underlying layer 41 relative to the light L4' and light L5' from intermediate layers 43, 44, which reduces the influence of intermediate layers 43, 44 (influence of concave figures of upper surfaces 3A, 4A) to allow detection of an accurate position of the underlying mark 31.

In addition, the spectral characteristic may be adjusted so as to increase among the illumination light L1, the intensity ratio of components of the wavelength range having a weak absorption by the underlying layer 41 relative to components of the wavelength range having a strong absorption by the underlying layer 41. Again, since the intensity ratio of the light L6' from the underlying layer 41 relative to the light L4' and the L5' from intermediate layers 43, 44 can be made large, it is possible to reduce the influence of intermediate layers 43, 44 and detect an accurate position of the underlying mark 31.

In addition, the spectral characteristic of the illumination light L1 may be adjusted while taking a combination of interference effect of lights L5, L4 reflected from upper surfaces 3A, 4A of intermediate layers 43, 44, absorption property at intermediate layers 43, 44 and absorption property at the underlying layer 41 into consideration.

Further, the above-described embodiment has described the example in which two intermediate layers 43, 44 are formed between the underlying layer 41 and the resist layer 42, but the invention is not limited thereto. The invention can be applied to such case that the number of the intermediate layer is one, or three or more. However, when the number of the intermediate layer is one, it is preferred to adjust the spectral characteristic of the illumination light L1 while taking absorption by the intermediate layer and absorption by the underlying layer into consideration.

In the above-described embodiment, the light source 12 emitting white light and the wavelength selecting section 13 are provided to the illumination system (12 to 16), but the invention is not limited thereto. It suffices to provide plural laser light sources having different wavelength ranges in place of the light source 12 and the wavelength selecting section 13, and select these laser light sources in accordance with an intended spectral characteristic of the illumination light L1.

Further, the above-described embodiment has described the example in which the duplex mark 30 is a bar in bar mark, but the mark may be of another type (for example, a frame in frame mark or a box in box mark). Two of a bar-like shape, a box-like shape and a frame-like shape may be combined. A crucial mark may be also used.

The above-described embodiment has described the example in which the influence of the intermediate layer formed above the underlying layer is reduced, but the spectral characteristic of the illumination light L1 may be adjusted so as to reduce the influence of another layer formed below the underlying layer.

Further, the above-described embodiment has described the position detecting device mounted in the superposition inspecting device 10 as the example, but the invention is not limited thereto. The invention can be also applied to a device for measuring a positional deviation amount of two marks formed on the same layer of the substrate 11, and a position detecting device mounted in a device for aligning the substrate 11 before an exposure process for the substrate 11 (that is, an alignment system of an exposure device). In the alignment system, position of an alignment mark formed on the underlying layer is detected, and positional relation between the detection result and a stage coordinate system (such as an interferometer) is searched. Again, a resist layer is formed above the alignment mark of an underlying layer via one or more intermediate layers.

In addition, the invention can be applied not only to the case where the position of above-described superposition mark or alignment mark is detected, but also to the case where the position of circuit pattern formed on an underlying layer of the substrate 10A is detected.

Furthermore, the same effect can be obtained not only in the case where the position of patterns of an underlying layer (such as an alignment mark, a superposition mark and a circuit pattern) is detected by the CPU 21 of the superposition inspecting device 10, but also in the case where an outside computer connected to the superposition inspecting device is used.

Ninth Embodiment

Hereinafter, a ninth embodiment of the invention will be described in detail using FIGS. 25 to 29.

Figure 25:
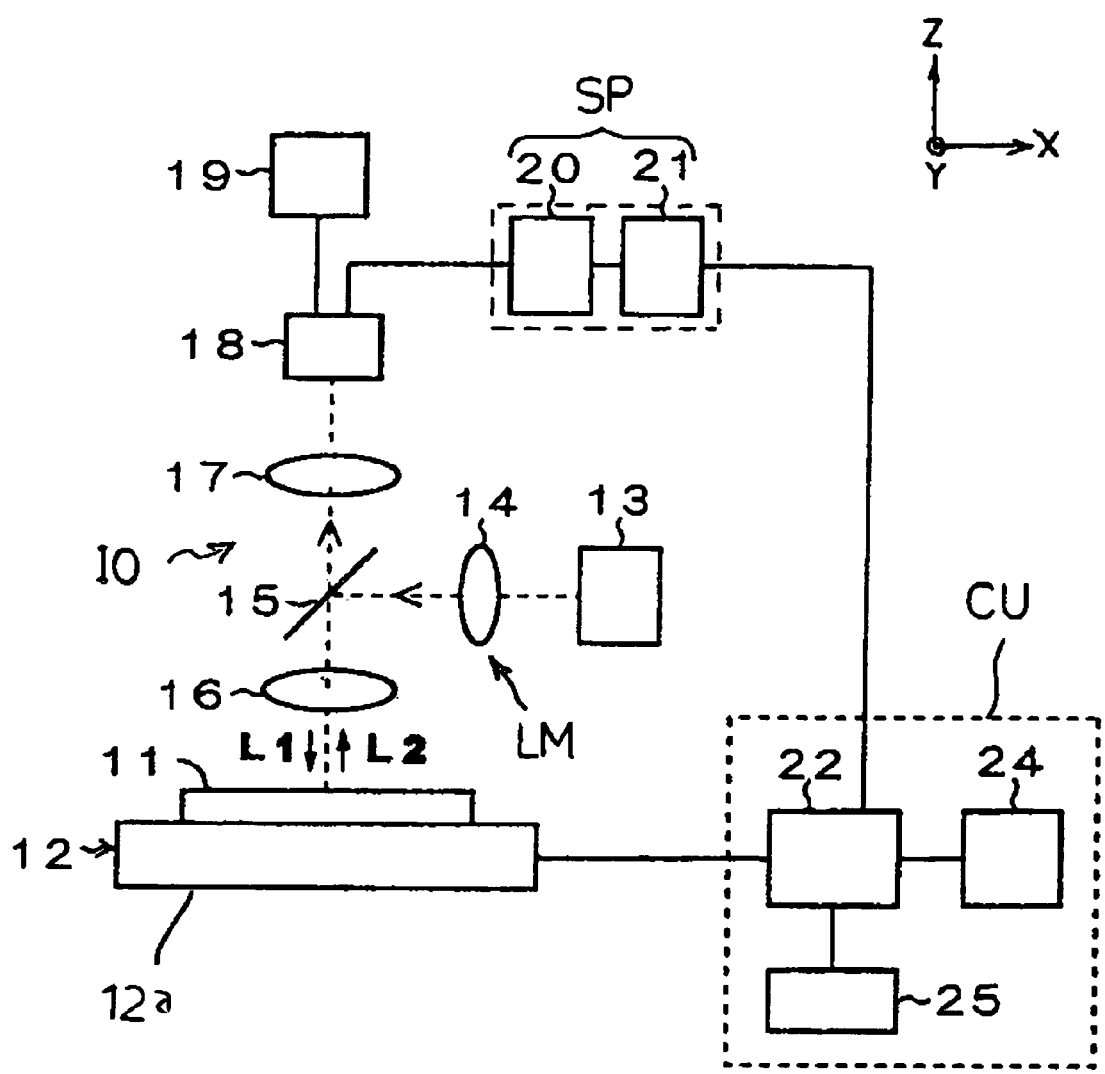
FIG. 25 is a block diagram illustrating constitution of a semiconductor measuring device provided with a mark identifying device according to a ninth embodiment.

FIG. 25 is a block diagram illustrating constitution of a semiconductor measuring device provided with the mark identifying device of the ninth embodiment of the invention.

The mark identifying device is composed of a stage 12 for supporting a wafer (substrate) 11, an illumination system LM for irradiating the wafer 11 with illumination light L1, an imaging system IO for forming an optical image of the wafer 11, an image pickup device 18, a TV monitor 19 for observation, a signal processing section SP, and a controlling section CU.

The stage 12 is constituted of a holder 12a for supporting the wafer 11 at a horizontal level, and a driving section (not shown) for moving the holder 12a in horizontal directions (XY directions). By moving the holder 12a of the stage 12 in XY directions, it is possible to position a part of the wafer 11 within the viewing region of imaging systems 16, 17.

The illumination system LM is constituted of a light source 13, an illuminating lens 1014, a half mirror 15, and an objective lens 16. The light from the light source 13 enters the wafer 11 on the stage 12 as the illumination light L1 through the illuminating lens 14, half mirror 15 and objective lens 16.

At this time, the illumination light L1 is irradiated approximately vertically to a portion positioned within the viewing region. The reflected light L2 is guided to the imaging system IO.

The imaging system IO is constituted of the objective lens 16 and an imaging lens 17. The imaging lens 17 functions as a second objective lens. The reflected light L2 from the wafer 11 enters an image pickup surface of an image pickup device 18 through the objective lens 16, the half mirror 15 and the imaging lens 17.

At this time, on the image pickup surface of the image pickup device 18, an expanded image based on the reflected light L2 is formed.

The image pickup device 18 is an area sensor in which plural pixels are two dimensionally disposed (for example, a CCD camera), and images an optical image of a mark on the image pickup surface to output an image signal to the TV monitor 19 and the signal processing section SP. When a recipe is prepared, an image signal from the image pickup device 18 is output to a monitor 24 of the controlling section CU.

The image signal output from the image pickup device 18 is composed of plural sample points, and indicates distribution concerning luminance values for respective pixels on the image pickup surface. The luminance value is proportional to intensity of the reflected light L2. The luminance value of a mark image varies at edge portions of the mark.

The signal processing section SP is constituted of a frame memory 20 and a CPU 21 for the waveform signal operation. At the time of superposition inspection of the resist pattern of the wafer 11 (not shown), the frame memory 20 stores an image signal from the image pickup device 18. The CPU 21 performs a predetermined signal processing on the image signal in the frame memory 20.

The controlling section CU is constituted of a computer 22 for controlling the whole device, a monitor 24, and an input section 25.

Figure 26:
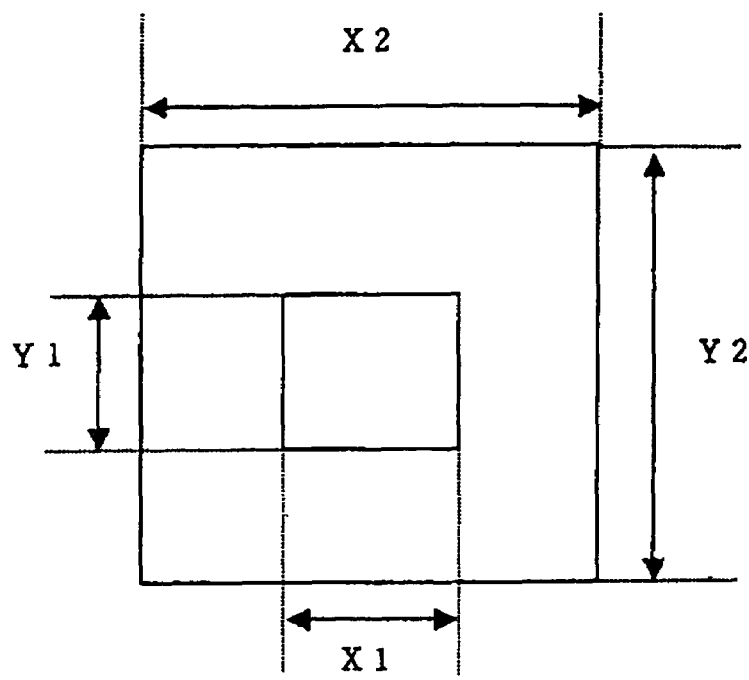
FIG. 26 illustrates a mark to be registered in advance.

FIG. 26 illustrates a mark to be registered in advance.

Prior to measurement of a mark (for example, superposition measurement) of the wafer 11, a recipe relating to a shape of a mark (rectangle), a designed size (dimension X1 of the inside of the mark in the X direction, dimension X2 of the outside of the mark in the X direction, dimension Y1 of the inside of the mark in the Y direction, dimension Y2 of the outside of the mark in the Y direction) and a size allowable error is prepared utilizing the monitor 24 and the input section 25. The recipe means data of the above-described figure and the like to be registered in a memory of the computer 22.

Next, a method of identifying a mark on a wafer will be described.

Figure 27:
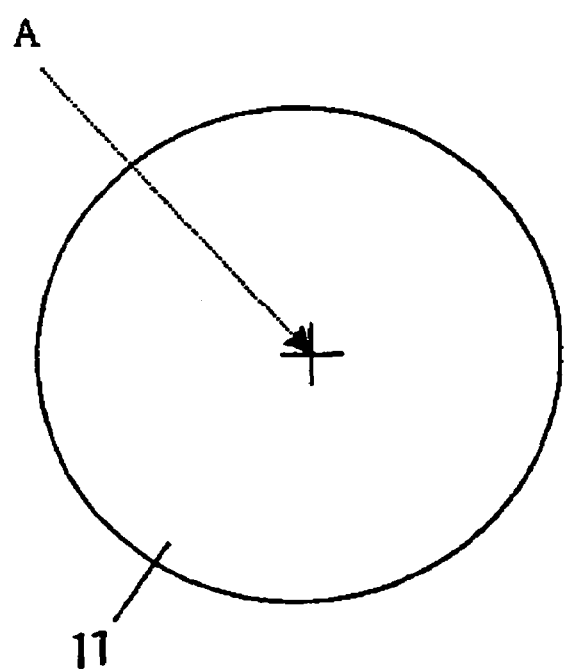
FIG. 27 is a plan view of a wafer.

FIG. 27 is a plan view of a wafer.

In FIG. 27, A indicates the designed coordinates of a mark on the wafer 11. FIG. 27 shows only a mark at designed coordinates at the central position of the wafer, but, actually, many marks are at plural designed coordinates which are not shown.

First, prior to measurement, designed coordinates of a mark on the wafer 11 is registered in a recipe utilizing the monitor 24 and the input section 25.

Next, vicinities of marks at designed coordinates are photographed.

The computer 22 detects a mark matching the shape and the designed size registered in the recipe from obtained images of marks.

Figure 28:
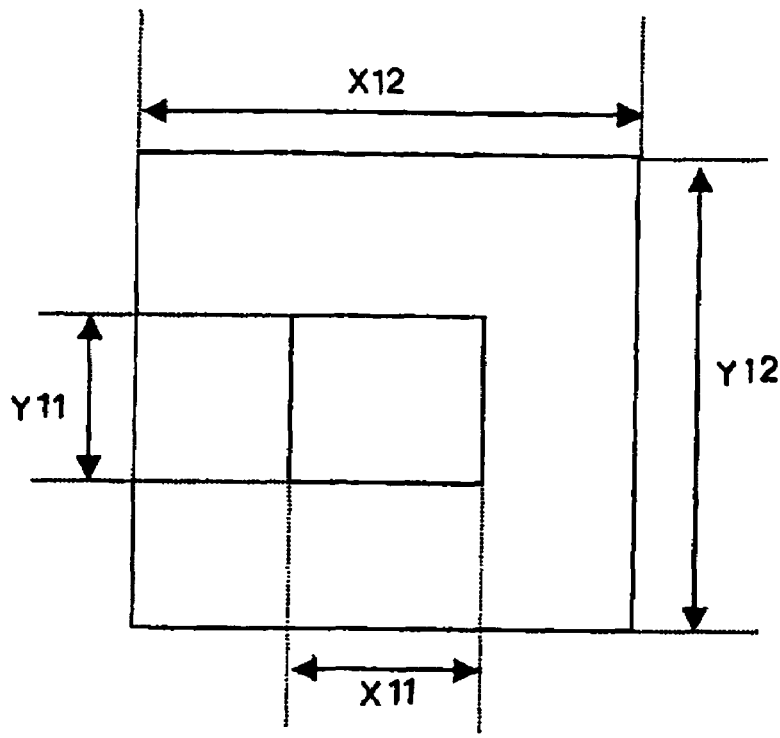
FIG. 28 shows an example of a photographed mark.
Figure 29:
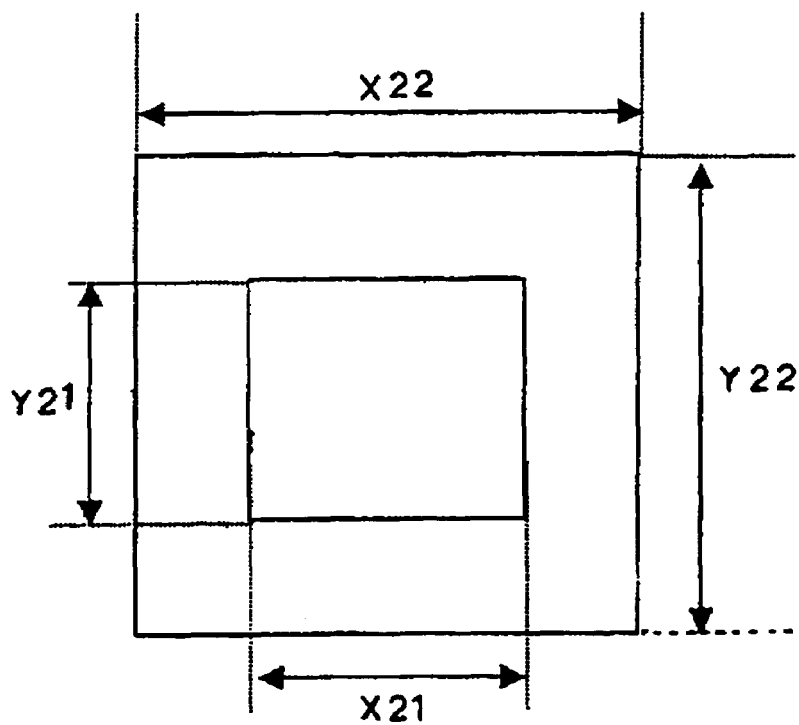
FIG. 29 shows an example of a photographed mark.

FIGS. 28 and 29 are drawings showing an example of photographed marks, respectively.

The inside dimension in the X direction, the outside dimension in the X direction, the inside dimension in the Y direction and the outside dimension in the Y direction of the mark in FIG. 28 are X11, X12, Y11 and Y12, respectively. X11 is within the tolerance of X1, X12 is within the tolerance of X2, Y11 is within the tolerance of Y1, and Y12 is within the tolerance of Y2.

The inside dimension in the X direction, the outside dimension in the X direction, the inside dimension in the Y direction and the outside dimension in the Y direction of the mark in FIG. 29 are X21, X22, Y21 and Y22, respectively. X21 is within the tolerance of X1 and X22 is within the tolerance of X2.

When comparing the size of the mark in FIG. 29 with the size of the registered mark, the outside dimension in the X direction X22 and the outside dimension in the Y direction Y22 of the mark are within the tolerance, but the inside dimension in the X direction X21 and the inside dimension in the Y direction Y21 of the mark are not within the tolerance. It is concluded that the mark in FIG. 29 is a mark that does not coincide with the size of the registered mark.

When comparing the size of the mark in FIG. 28 with the size of the registered mark, the inside dimension in the X direction X11, the outside dimension in the X direction X12, the inside dimension in the Y direction Y11 and the outside dimension in the Y direction Y12 of the mark are within the tolerance of the inside dimension in the X direction X1 of the registered mark, the outside dimension in the X direction X2 of the mark, the inside dimension in the Y direction Y1 of the mark and the outside dimension in the Y direction Y2 of the mark, respectively. It is concluded that the mark in FIG. 28 is a mark that coincides with the size of the registered mark.

After the end of the identification work as described above, superposition measurement of the resist pattern (not shown) or the like is performed using the mark that is determined to coincide with the data in the recipe.

According to this embodiment, since the figure, designed size and the like of the mark have been registered in the recipe prior to the measurement of the mark of the wafer 11, the mark can be identified without using a substrate having the mark.

In addition, since a mark same as the mark to be measured is not photographed and an image thereof is not registered in the recipe, therefore, the operating rate of the semiconductor measuring device can be improved, compared with a conventional example in which a mark is photographed before identification.

The invention is not limited to the above embodiments and various modifications may be made without departing from the spirit and scope of the invention. Any improvement may be made in part or all of the components.

What is claimed is:

1. A method of adjusting an optical imaging system, comprising the steps of:
providing an object in the optical imaging system;
directing an epi-illumination light toward the object;
providing, on a surface of the object, a first mark and a second mark so that the first mark and the second mark are symmetric relative to a center of a visual field of the optical imaging system, the first mark being disposed at a first pitch which is equal to or more than a pitch such that first order diffracted beams in both a positive and negative direction in a predetermined wavelength band of the light can be located within a pupil area of the optical imaging system, the second mark being disposed at a second pitch which is smaller than the first pitch; and
adjusting a position of an optical element according to a relative position of an image of said first mark and an image of said second mark formed by said optical imaging system, the optical element being disposed between a pupil plane and an aperture stop surface of said optical imaging system,
wherein the following conditional equations are satisfied:

$NAima > NAill$ $NAima - NAill > \lambda/P1$ $NAima + NAill/2 \leq \lambda/P2$, where said first pitch is P1 (μm), said second pitch is P2 (μm), numerical aperture of said optical imaging system is NAima, numerical aperture of an optical system used for irradiating said illumination light is Naill, and a central wavelength of said illumination light is λ (μm).

2. The method of adjusting an optical imaging system according to claim 1, comprising the steps of:
measuring a distance between said first mark and said second mark in an image formed by said optical imaging system, before and after rotating said first and second marks by 180° relative to said center of the visual field,
calculating a tool induced shift amount from two measured distances and
adjusting the position of said optical element according to the calculated shift amount.

3. The method of adjusting an optical imaging system according to claim 1, comprising the steps of:
obtaining, while changing a wavelength band of said illumination light, the relative position of the image of said first mark and the image of said second mark in each wavelength band, and adjusting the position of said optical element according to the relative position obtained in each wavelength band.

4. The method of adjusting an optical imaging system according to claim 1, wherein:
said optical element is a parallel flat plate; and
the position of said optical element is adjusted by tilting said parallel flat plate.

5. A method of adjusting an optical imaging system, comprising the steps of:
providing an object in the optical imaging system;
directing an epi-illumination light toward the object;
providing, on a surface of the object, a first mark and a second mark so that the first mark and the second mark are symmetric relative to a center of a visual field of the optical imaging system, the first mark being disposed at a first pitch which is equal to or more than a pitch such that first order diffracted beams in both a positive and negative direction in a predetermined wavelength band of the light can be located within a pupil area of the optical imaging system, the second mark being disposed at a second pitch which is smaller than the first pitch; and adjusting a position of an optical element according to a relative position of an image of said first mark and an image of said second mark formed by said optical imaging system, the optical element being disposed between a pupil plane and an aperture stop surface of said optical imaging system;

obtaining, while changing a wavelength band of said illumination light, the relative position of the image of said first mark and the image of said second mark in each wavelength band;

adjusting the position of said optical element according to the relative position obtained in each wavelength band; and adjusting the position of said optical element, using as an index a difference between distances between the image of said first mark and the image of said second mark calculated in each wavelength band of said illumination light, or a difference between tool induced shift amounts calculated in each wavelength band of said illumination light.

* * * * *